(12) United States Patent
Obu et al.

(10) Patent No.: US 9,378,944 B2
(45) Date of Patent: Jun. 28, 2016

(54) METHOD AND APPARATUS OF FORMING CARBON FILM

(71) Applicant: TOKYO ELECTRON LIMITED, Tokyo (JP)

(72) Inventors: Tomoyuki Obu, Nirasaki (JP); Satoshi Mizunaga, Nirasaki (JP); Takehiro Otsuka, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 127 days.

(21) Appl. No.: 13/937,902

(22) Filed: Jul. 9, 2013

(65) Prior Publication Data

US 2014/0011368 A1      Jan. 9, 2014

(30) Foreign Application Priority Data

Jul. 9, 2012   (JP) .................................. 2012-153897
May 13, 2013  (JP) .................................. 2013-101484

(51) Int. Cl.

| H01L 21/31 | (2006.01) |
|---|---|
| H01L 21/469 | (2006.01) |
| H01L 21/02 | (2006.01) |
| C23C 16/02 | (2006.01) |
| C23C 16/26 | (2006.01) |

(52) U.S. Cl.
CPC ...... H01L 21/02304 (2013.01); C23C 16/0272 (2013.01); C23C 16/26 (2013.01); H01L 21/02115 (2013.01); H01L 21/02271 (2013.01)

(58) Field of Classification Search
CPC .................. H01L 21/02304; H01L 21/02271; H01L 21/477; H01L 21/02115; C23C 16/0272; C23C 16/26

USPC .................... 438/763; 257/725; 118/E21.497
See application file for complete search history.

(56) References Cited

U.S. PATENT DOCUMENTS

| 8,409,460 B2 | 4/2013 | Ishikawa et al. |
| 2010/0047448 A1* | 2/2010 | Morisaki ............. C23C 16/4584 |
| | | 427/248.1 |

FOREIGN PATENT DOCUMENTS

| JP | 2002-12972 A | 1/2002 |
|---|---|---|
| JP | 2002-194547 A | 7/2002 |
| JP | 2005-64302 A | 3/2005 |
| JP | 2007-180389 A | 7/2007 |
| JP | 2007-224383 A | 9/2007 |

(Continued)

*Primary Examiner* — Charles Garber
*Assistant Examiner* — Abdulfattah Mustapha
(74) *Attorney, Agent, or Firm* — Nath, Goldberg & Meyer; Jerald L. Meyer

(57) ABSTRACT

According to an embodiment of present disclosure, a method of forming a carbon film on a substrate to be processed is provided. The method includes loading a substrate to be processed with a carbon film formed thereon into a processing chamber of a film forming apparatus (Process 1), and thermally decomposing a hydrocarbon-based carbon source gas in the processing chamber to form a carbon film on the substrate to be processed (Process 2). In Process 2, a film forming temperature of the carbon film is set to a temperature less than a thermal decomposition temperature of a simple substance of the hydrocarbon-based carbon source gas without plasma assistance, the hydrocarbon-based carbon source gas and a thermal decomposition temperature drop gas containing a halogen element are introduced into the processing chamber, and a non-plasma thermal CVD method is performed.

18 Claims, 17 Drawing Sheets

(56) References Cited

FOREIGN PATENT DOCUMENTS

| | | | |
|---|---|---|---|
| JP | 2009-505402 A | | 2/2009 |
| JP | 2009123795 A | * | 6/2009 |
| JP | 2011-14872 A | | 1/2011 |
| JP | 2011-181903 A | | 9/2011 |
| JP | 2012-17502 A | | 1/2012 |
| WO | 2008/105321 A1 | | 9/2008 |

* cited by examiner

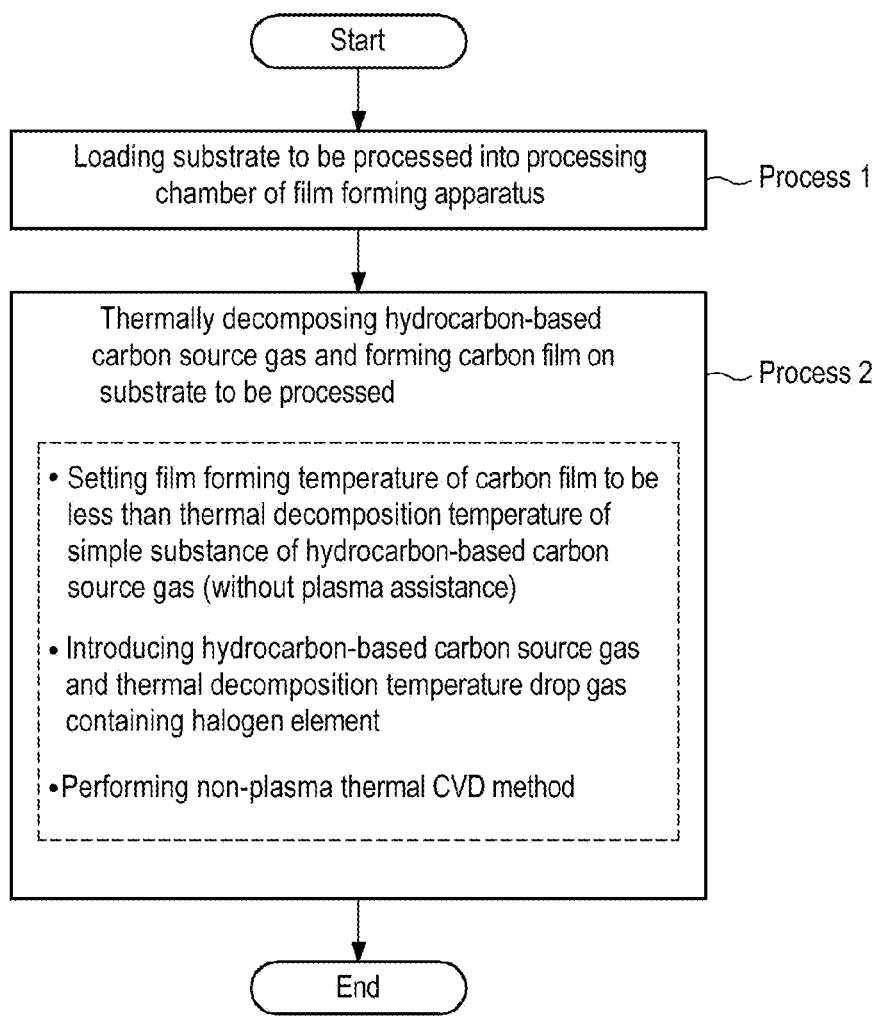

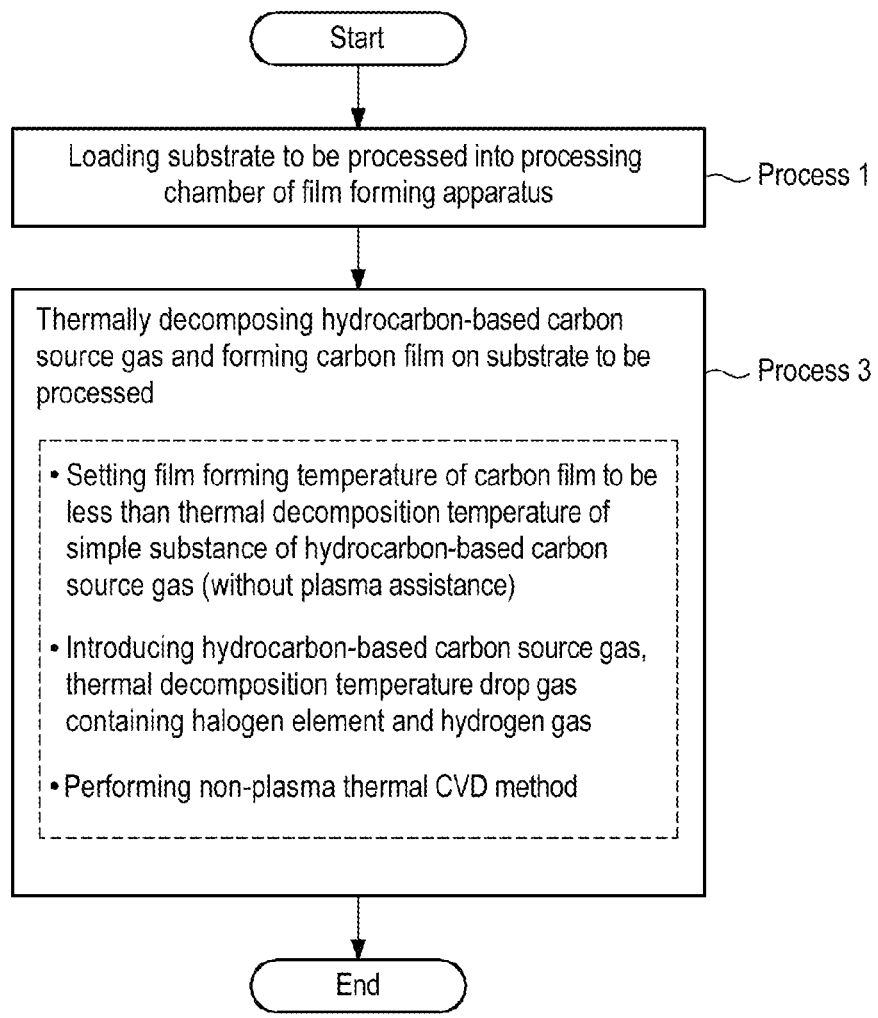

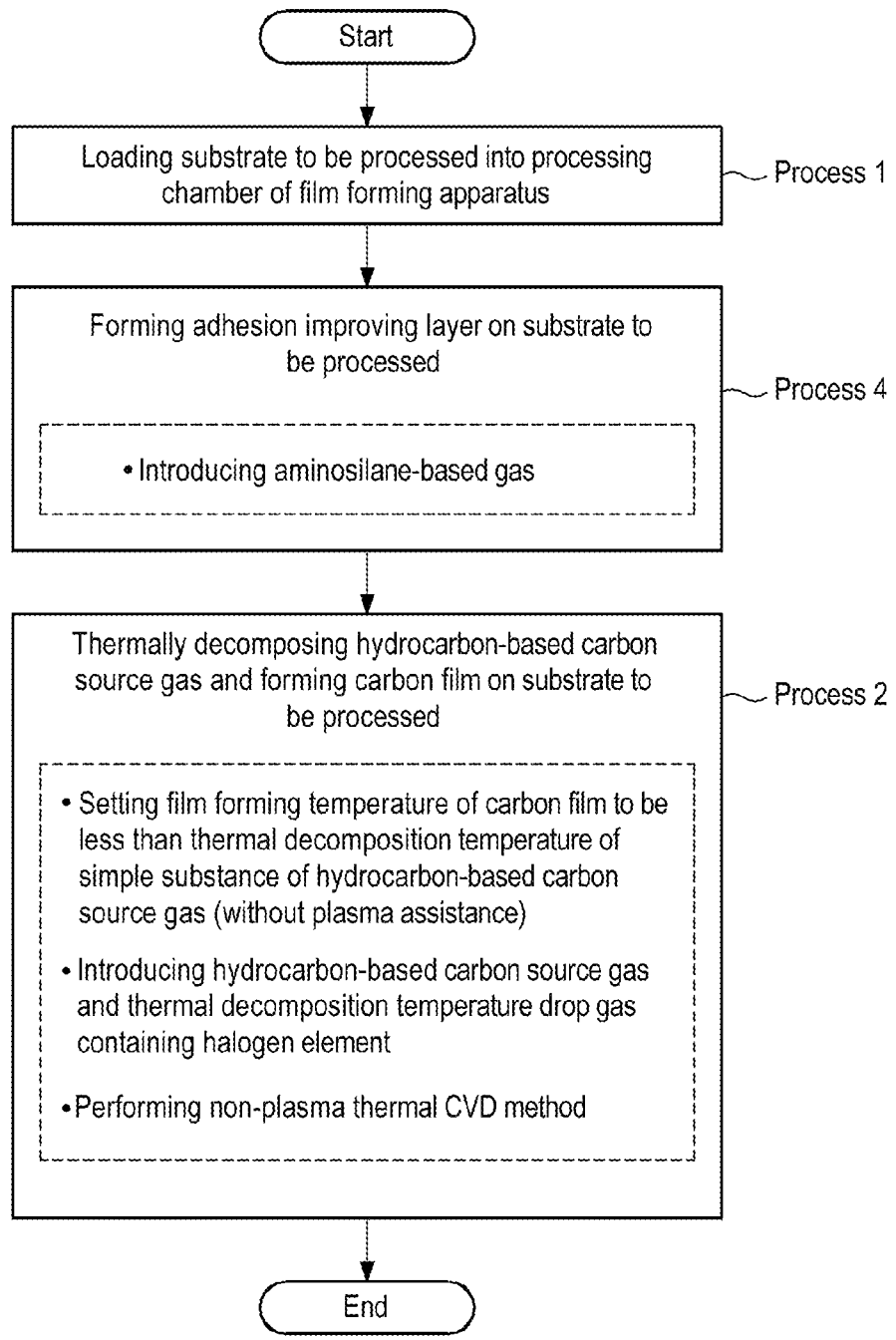

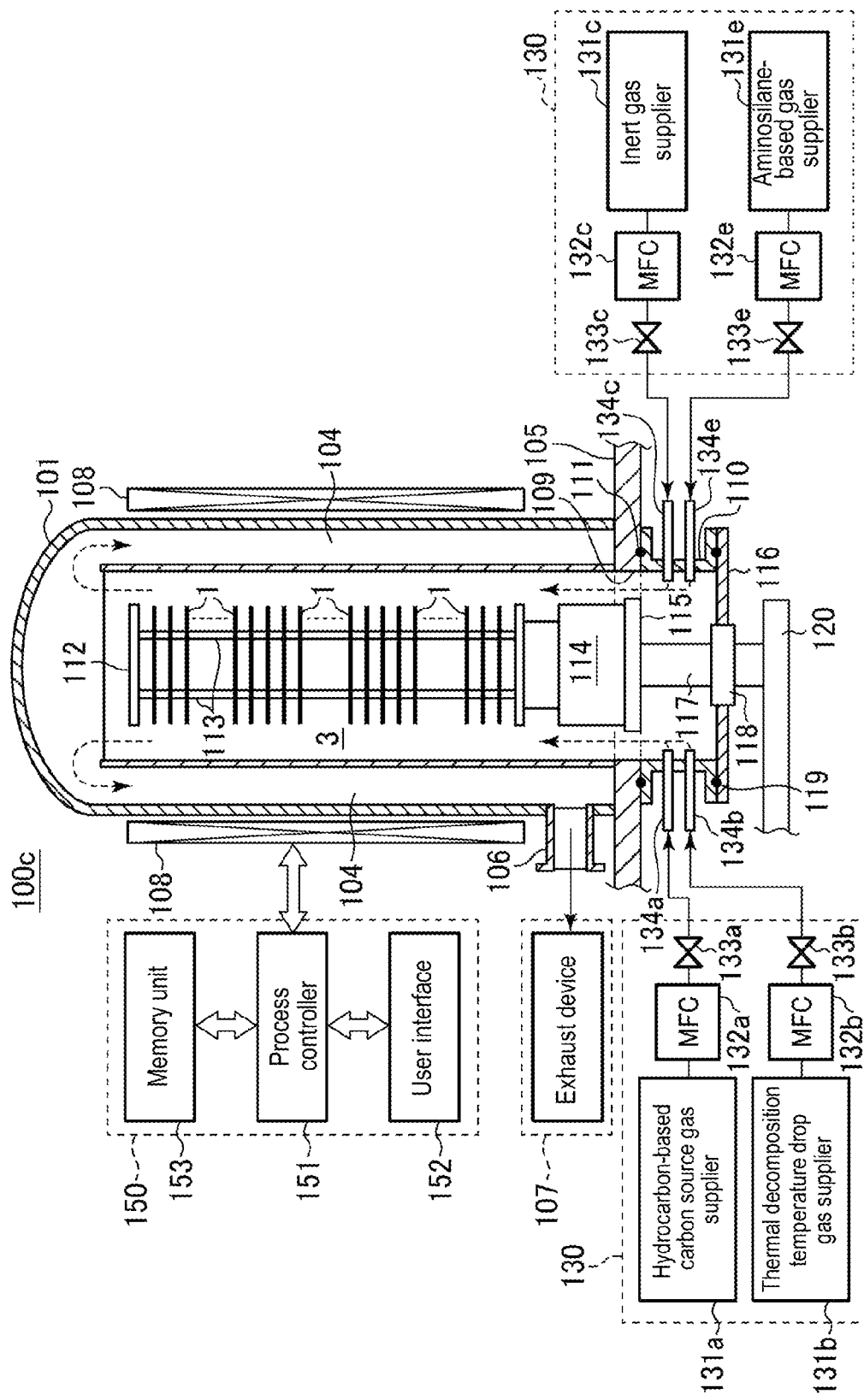

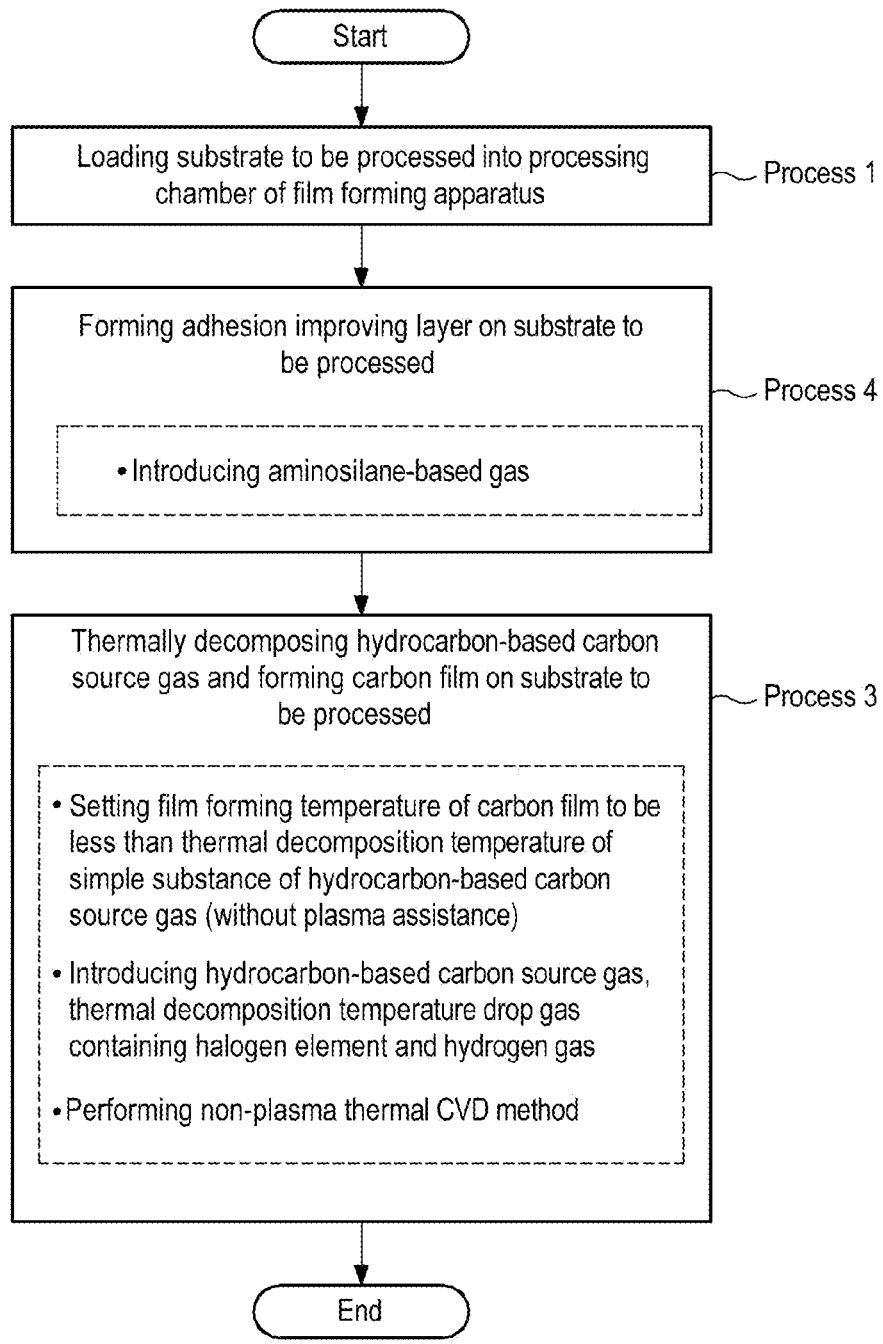

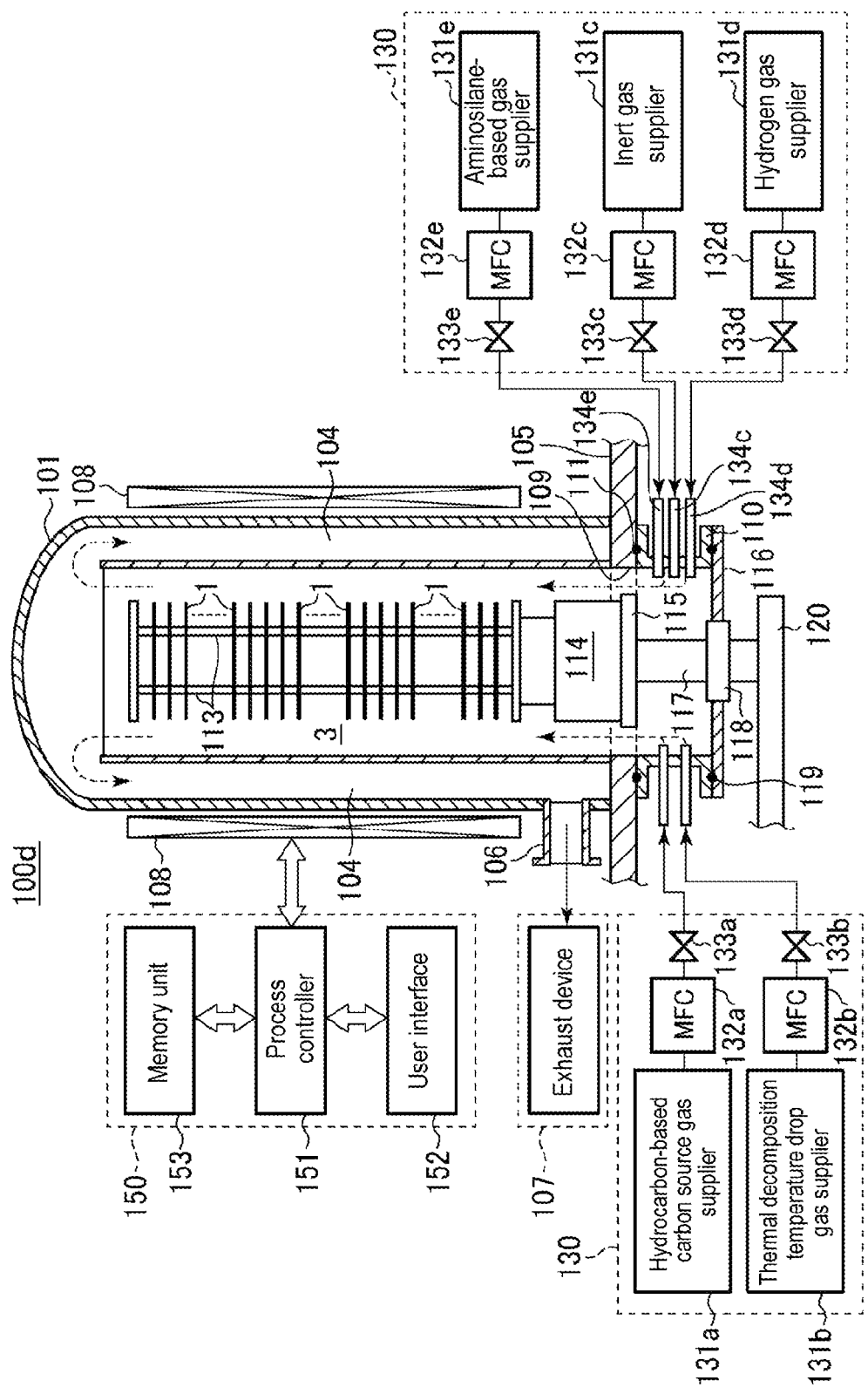

METHOD AND APPARATUS OF FORMING CARBON FILM

CROSS-REFERENCE TO RELATED APPLICATIONS

This application claims the benefit of Japanese Patent Application Nos. 2012-153897 and 2013-101484, filed on Jul. 9, 2012 and May 13, 2013, respectively, in the Japan Patent Office, the disclosure of which is incorporated herein in their entirety by reference.

TECHNICAL FIELD

The present disclosure relates to a method and apparatus of forming a carbon film.

BACKGROUND

A carbon (C) has been more important as one of next semiconductor materials. For example, a carbon film is used as an antireflection film in a photolithography process, a hard mask in an etching process, an interlayer insulation film with low dielectric constant, a protective film for preventing step punching of a silicon carbide (SiC) wafer, or the like. The carbon film is expected to be used more widely in future.

As a method of forming a carbon film, a plasma CVD method or a thermal CVD method have been suggested.

Also, it has been suggested to added fluorine (F) in a carbon film.

As such, the carbon film, which is used in manufacturing a semiconductor device, is widely applicable in a variety of fields.

However, when a carbon film is formed using the plasma CVD method, although the film forming temperature is suppressed to be low (for example, 100 degrees C. to 500 degrees C.), step coatability may not be good. Accordingly, the carbon film formation using the plasma CVD method is unsuitable for forming a film on an underlayer having concave and convex portion such as a line pattern or a hole pattern.

In addition, when a carbon film is formed using the thermal CVD method, although step coatability is good, the film forming temperature should be high (for example, 800 degrees C. to 1000 degrees C.). Accordingly, the thermal CVD method is unsuitable for forming a carbon film on an upper layer portion of a semiconductor device due to thermal effects, for example, to transistors formed on a silicon wafer.

SUMMARY

The present disclosure is to provide a method of forming a carbon film, which provides a carbon film having good step coatability to be formed at a lower temperature than that required for a conventional thermal CVD method, and an apparatus for performing the method to be performed.

According to a first aspect of the present disclosure, provided is a method of forming a carbon film on a substrate to be processed. The method includes loading a substrate to be processed, on which a carbon film will be formed, into a processing chamber of a film forming apparatus; and forming a carbon film on the substrate to be processed by thermally decomposing a hydrocarbon-based carbon source gas in the processing chamber. In forming the carbon film, a film forming temperature of the carbon film is set to a temperature less than a thermal decomposition temperature at which a simple substance of the hydrocarbon-based carbon source gas is thermally decomposed without plasma assistance and a thermal decomposition temperature drop gas. Further, the hydrocarbon-based carbon source gas and a thermal decomposition temperature drop gas containing a halogen element are introduced into the processing chamber, and a non-plasma thermal CVD method is performed in forming the carbon film on the substrate to be processed.

According to a second aspect of the present disclosure, provided is an apparatus of forming a carbon film on a substrate to be processed. The apparatus includes a processing chamber configured to accommodate a substrate to be processed including an underlayer on which a carbon film will be formed and a processing gas supply mechanism configured to supply the processing chamber with gas used in processing. The apparatus further includes a heating device configured to heat the substrate to be processed accommodated in the processing chamber and a controller configured to control the processing gas supply mechanism and the heating device. Further, the controller controls the processing gas supply mechanism and the heating device so as to perform the method of forming a carbon film according to the first aspect.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a flow chart illustrating an example of a method of forming a carbon film according to a first embodiment of the present disclosure;

FIG. 6 is a flow chart illustrating an example of a method of forming a carbon film according to a third embodiment of the present disclosure;

FIG. 9 is a flow chart illustrating one example of a method of forming a carbon film according to a fourth embodiment of the present disclosure;

FIG. 11 is a sectional view schematically showing an example of a vertical batch type film forming apparatus for performing the one example of the method of forming a carbon film according to the fourth embodiment of the present disclosure to be performed;

FIG. 12 is a flow chart illustrating another example of the method of forming a carbon film according to the fourth embodiment of the present disclosure;

FIG. 13 is a sectional view schematically showing an example of a vertical batch type film forming apparatus for performing the other example of the method of forming a carbon film according to the fourth embodiment of the present disclosure to be performed;

DETAILED DESCRIPTION

Figure 2A:
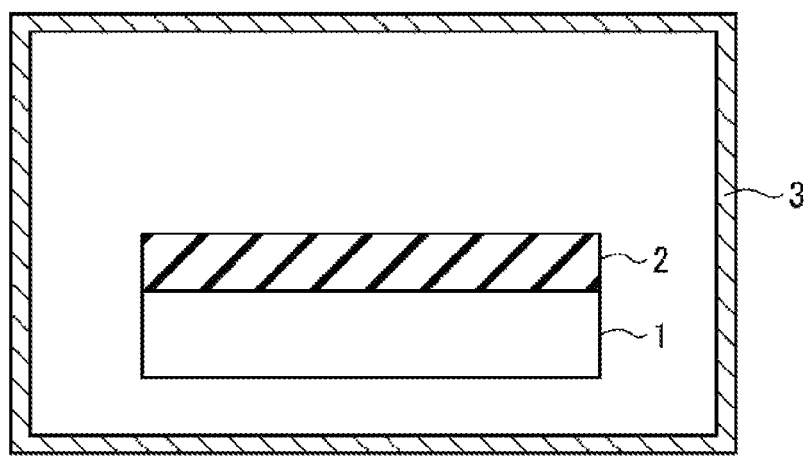
FIGS. 2A and 2B are sectional views schematically showing a state of an object to be processed.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments. Throughout the drawings, like reference numerals are used to designate like elements.

First Embodiment

Figure 2B:
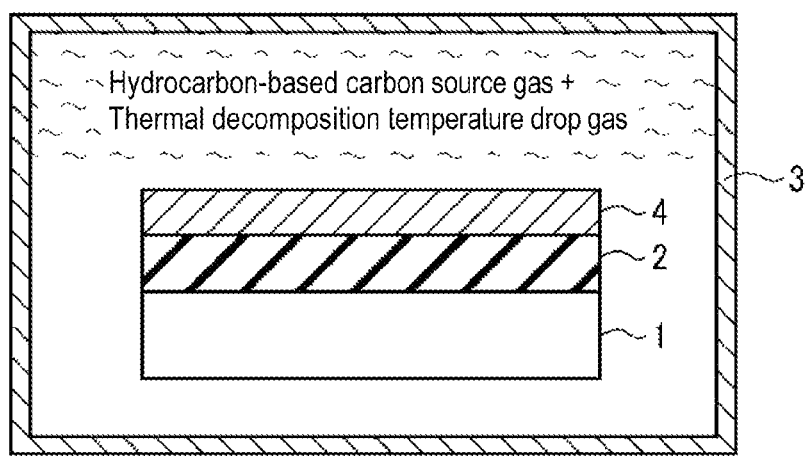

FIG. 1 is a flow chart illustrating an example of a method of forming a carbon film according to a first embodiment of the present disclosure, and FIGS. 2A and 2B are sectional views schematically showing a state of an object to be processed. In addition, FIGS. 2A and 2B schematically show a processing chamber of a film forming apparatus.

As shown in Process 1 of FIG. 1 and FIG. 2A, a substrate to be processed, for example, such as a silicon substrate 1 having a silicon oxide film 2 formed on a surface thereof, is loaded into a processing chamber 3 of a film forming apparatus.

Then, as shown in Process 2 of FIG. 1 and FIG. 2B, hydrocarbon-based carbon source gas is thermally decomposed in the processing chamber 3, and a carbon film 4 is formed on the substrate to be processed. In this example, the carbon film 4 is formed on the silicon oxide film 2 of the silicon substrate 1.

In Process 2 of this example, a film forming temperature for the carbon film 4 is set to a temperature less than a thermal decomposition temperature of a simple substance of the hydrocarbon-based carbon source gas. The thermal decomposition temperature is a temperature at which hydrocarbon-based carbon source gas is thermally decomposed without plasma assistance while thermal decomposition temperature drop gas is not introduced into the processing chamber 3. On this account, along with the hydrocarbon-based carbon source gas, the thermal decomposition temperature drop gas for dropping the thermal decomposition temperature of the hydrocarbon-based carbon source gas is introduced into the processing chamber 3. Further, in order to improve the step coatability, the carbon film 4 is formed by a non-plasma thermal CVD method (i.e., a thermal CVD method without plasma assistance) in this example.

An example of the thermal decomposition temperature drop gas is a gas containing a halogen element. The halogen element includes:
fluorine (F),
chlorine (Cl),
bromine (Br), and
iodine (I)

In addition, it is preferable to introduce these halogen elements such as fluorine ($F_2$) gas, chlorine ($Cl_2$) gas, bromine ($Br_2$) gas and an iodine ($I_2$) gas as simple substance gas rather than as compound gas. This is because if the thermal decomposition temperature drop gas is not a simple substance gas but the compound gas of halogen elements, a higher temperature is needed to thermally decompose this compound gas, and thus, it is not effective to drop the thermal decomposition temperature of the hydrocarbon-based carbon source gas.

In addition, fluorine among the halogen elements has high reactivity as compared with chlorine, bromine and iodine. On this account, surface roughness or flatness of a carbon film to be formed may possibly be deteriorated. Accordingly, it is preferable to exclude fluorine and select one of chlorine, bromine and iodine as the halogen element.

Also, in terms of handling safety, it is preferable to select chlorine rather than bromine and iodine.

Further, the hydrocarbon-based carbon source gas includes gases containing hydrocarbons represented by at least one of the following molecular formulae:
$C_nH_{2n+2}$,
$C_mH_{2m}$, and
$C_mH_{2m-2}$.
wherein n is a natural number equal to or larger than 1, and m is a natural number equal to or larger than 2.

Furthermore, the hydrocarbon-based carbon source gas may include benzene gas ($C_6H_6$).

The hydrocarbon represented by the molecular formula of $C_nH_{2n+2}$ may include:
methane gas ($CH_4$),
ethane gas ($C_2H_6$),
propane gas ($C_3H_8$),
butane gas ($C_4H_{10}$, including other isomers),
pentane gas ($C_5H_{12}$, including other isomers), and the like.

The hydrocarbon represented by the molecular formula of $C_mH_{2m}$ may include:
ethylene gas ($C_2H_4$),
propylene gas ($C_3H_6$, including other isomers),
butylene gas ($C_4H_8$, including other isomers),
pentene gas ($C_5H_{10}$, including other isomers), and the like.

The hydrocarbon represented by the molecular formula of $C_mH_{2m-2}$ may include:
acetylene gas ($C_2H_2$),
propyne gas ($C_3H_4$, including other isomers),
butadiene gas ($C_4H_6$, including other isomers),
isoprene gas ($C_5H_8$, including other isomers), and the like.

Ethylene ($C_2H_4$) gas may be used as the hydrocarbon-based carbon source gas in this example, and chlorine ($Cl_2$) gas may be used as the thermal decomposition temperature drop gas.

In this way, the ethylene gas and the chlorine gas may be used to form the carbon film 4 under the following processing conditions:
Ratio of Gas Flow Rates: $C_2H_4:Cl_2$=500:100 sccm
Film Forming Temperature: 450 degrees C.
Processing Pressure: 997.5 Pa (7.5 Torr)
Processing Time: 60 min Under the above processing conditions, it was confirmed that the carbon film 4 having a thickness of 20 nm or so was formed on the silicon oxide film 2 (wherein the carbon film 4 was, for example, an amorphous carbon).

In the method of forming a carbon film according to the first embodiment, although a thermal CVD method without using plasma assistance is performed, the carbon film 4 can be formed at a film forming temperature of 450 degrees C., which is lower than a conventional thermal decomposition temperature of hydrocarbon-based carbon source gas, for example 800 degrees C. to 1000 degrees C.

In addition, the film forming temperature is set to 450 degrees C. in this example. However, even when the film forming temperature is a lower temperature than 450 degrees C., for example 300 degrees C., it is possible to form the carbon film 4 without plasma assistance by performing the method of forming a carbon film according to the embodiment of the present disclosure. Because the gas containing a halogen element among the hydrocarbon ($C_XH_Y$)-based carbon source gases is added to promote the decomposition of the hydrocarbon ($C_XH_Y$), it possible to form a carbon film at a lower temperature as compared with when a gas containing no halogen element is added. In this example, chlorine ($Cl_2$) gas is added in ethylene ($C_2H_4$) gas, and the added chlorine ($Cl_2$) draws hydrogen (H) from the ethylene ($C_2H_4$). Accordingly, the ethylene is decomposed and the carbon (C) is left.

A chemical reaction formula is as follows:

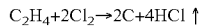

$$C_2H_4 + 2Cl_2 \rightarrow 2C + 4HCl \uparrow$$

As such, this example may use a combination of alkene representative of ethylene ($C_2H_4$) gas, which is represented by the molecular formula of $C_mH_{2m}$, and chlorine ($Cl_2$) gas. Meanwhile, the hydrocarbon-based carbon source gas represented by the molecular formula of $C_mH_{2m-2}$ has a thermal decomposition temperature less than that represented by the molecular formula of $C_mH_{2m}$. Therefore, as compared with the above combination, another combination of the acetylene ($C_2H_2$) gas or alkyne(or diene) representative of $C_5H_8$ (for example, pentyne or isoprene) gas, which are represented by the molecular formula of $C_mH_{2m-2}$ and chlorine ($Cl_2$) gas is easily decomposed. For this reason, if a gas containing the hydrocarbon represented by the molecular formula of $C_mH_{2m-2}$ is used as the carbon source gas, it is expected that the film forming temperature may be shifted to a lower temperature and a carbon film can also be more practically formed.

Therefore, according to the first embodiment, the method of forming a carbon film provides a carbon film having better step coatability to be formed at a lower temperature without using plasma assistance than a conventional thermal CVD method.

In this way, the first embodiment can form a carbon film having better step coatability at a lower temperature than a conventional thermal CVD method, while a conventional plasma CVD method is unsuitable to form the carbon film on an underlayer having concave and convex portions such as a line pattern or a hole pattern although the conventional plasma CVD method can form the carbon film at a low film forming temperature. As a result, it is possible to obtain an advantageous effect such as the carbon film 4 being formed at a low temperature while suitable for being formed on an underlayer having concave and convex portions such as a line pattern or a hole pattern.

In addition, as a carbon film is formed at a low temperature, it is possible to obtain an advantageous effect in that the carbon film 4 can be applied to a process of an upper layer portion of a semiconductor device, for example, to pattern the wiring in an upper layer portion in a multilayer wiring structure or pattern holes for burying the wiring.

Second Embodiment

A second embodiment relates to an example of a film forming apparatus for performing the method of forming a carbon film according to the first embodiment to be performed.

Figure 3:
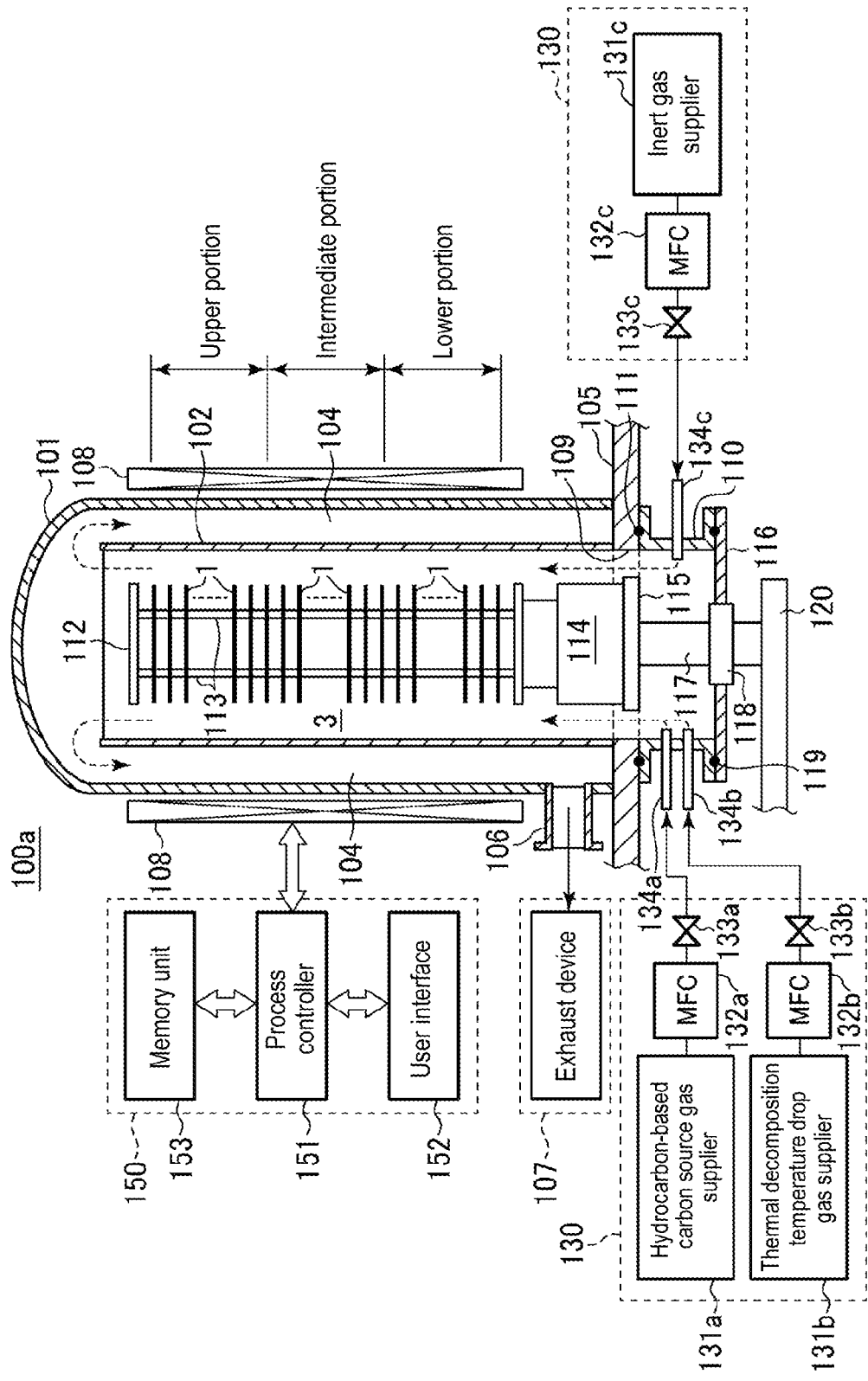
FIG. 3 is a sectional view schematically showing an example of a vertical batch type film forming apparatus according to a second embodiment of the present disclosure.

FIG. 3 is a sectional view schematically showing an example of a vertical batch type film forming apparatus according to the second embodiment of the present disclosure.

As shown in FIG. 3, a vertical batch type film forming apparatus (hereinafter, referred to as a film forming apparatus) 100a is provided with a cylindrical outer wall 101 having a ceiling, and a cylindrical inner wall 102 installed inside the outer wall 101. The outer wall 101 and the inner wall 102 are made, for example, of quartz. The interior of the inner wall 102 is defined as the processing chamber 3, in which objects to be processed are accommodated. In this example, the objects to be processed are a plurality of the silicon substrates 1, and the film forming processing on the plurality of silicon substrates 1 accommodated is performed in a lump. In the interior of the processing chamber 3, the method of forming a carbon film described in the first embodiment is performed on the plurality of silicon substrates 1 in a lump.

The outer wall 101 and the inner wall 102 are spaced apart from each other in the horizontal direction to define an annular space 104, and a lower end of each wall is joined to a base member 105. An upper end of the inner wall 102 is spaced apart from the ceiling of the outer wall 101, and an upper portion of the processing chamber 3 is in communication with the annular space 104. An exhaust path of the annular space 104 communicates with the upper portion of the processing chamber 3. A gas is supplied and spread to the processing chamber 3, then flows from a lower portion of the processing chamber 3 to the upper portion of the processing chamber 3. Then, the gas is sucked into the annular space 104. An exhaust pipe 106 is connected, for example, to a lower end of the annular space 104 and is connected to an exhaust device 107. The exhaust device 107 including a vacuum pump and the like (not shown) allows the used gas in the processing to be exhausted from the interior of the processing chamber 3, and also adjusts the pressure in the processing chamber 3 to be suitable for the processing.

A heating device 108 is provided outside the outer wall 101 to surround the processing chamber 3. The heating device 108 adjusts the temperature in the processing chamber 3 to be suitable for the processing and heats the objects to be processed, e.g., the plurality of silicon substrates 1.

The lower portion of the processing chamber 3 is in communication with an opening 109 formed in the base member 105. A manifold 110, which is formed in a cylindrical shape, for example, of stainless steel, is connected to the opening 109 via a seal member 111 such as an O-ring. A lower end of the manifold 110 has an opening through which a boat 112 is inserted into the processing chamber 3. The boat 112 is made, for example, of quartz, and has a plurality of pillars 113. The pillars 113 each have grooves (not shown) formed therein, and a plurality of substrates to be processed are totally supported by the grooves. Accordingly, the boat 112 may allow the plurality of sheets, for example 50 to 150 sheets of the silicon substrates 1, as the substrates to be processed, to be mounted in a multistage manner. The boat 112 having the plurality of silicon substrates 1 mounted therein is inserted into the processing chamber 3, so that the plurality of silicon substrates 1 can be accommodated inside the processing chamber 3.

The boat 112 is mounted on a table 115 via a thermos container 114 made of quartz. The table 115 is supported on a rotating shaft 117, which penetrates a lid portion 116, for example made of stainless steel. The lid portion 116 opens and closes the lower end opening of the manifold 110. The lid portion 116 is penetrated by the rotating shaft 117, for example, the penetrated portion, is fitted with a magnetic fluid seal 118 which air-tightly seals and rotatably supports the rotating shaft 117. In addition, a sealing member 119 such as an O-ring is interposed and installed between a periphery of the lid portion 116 and the lower end of the manifold 110 and thus maintains the processing chamber 3 to be sealed. The rotating shaft 117 is mounted to a leading end of an arm 120 supported by a lift mechanism (not shown) such as a boat elevator. Accordingly, the wafer boat 112, the lid portion 116 and the like are lifted up or down in the vertical direction together so that they can be inserted into or separated from the processing chamber 3.

The film forming apparatus 100a has a processing gas supply mechanism 130 for supplying gases used in the processing into the processing chamber 3.

In this example, the processing gas supply mechanism 130 includes a hydrocarbon-based carbon source gas supplier 131a, a thermal decomposition temperature drop gas supplier 131b and an inert gas supplier 131c. In this example, ethylene ($C_2H_4$) gas is used as the hydrocarbon-based carbon source gas, and chlorine ($Cl_2$) gas is used as the thermal decomposition temperature drop gas. In addition, nitrogen ($N_2$) gas is used as the inert gas. The hydrocarbon-based carbon source gas and the thermal decomposition temperature drop gas are used in Process 2 of the first embodiment, and the inert gas may be used as a purge gas for the purging before and after Process 2, or as a dilution gas in Process 2.

The hydrocarbon-based carbon source gas supplier 131a is connected to a gas supply port 134a via a mass flow controller (MFC) 132a and an opening/closing valve 133a. In the same manner, the thermal decomposition temperature drop gas supplier 131b is connected to a gas supply port 134b via a mass flow controller (MFC) 132b and an opening/closing valve 133b. The inert gas supplier 131c is connected to a gas supply port 134c via a mass flow controller (MFC) 132c and an opening/closing valve 133c. Each of the gas supply ports 134a to 134c is installed to penetrate a sidewall of the manifold 110 in the horizontal direction and allows the supplied gas to spread toward the interior of the processing chamber 3 positioned above the manifold 110. The supplied gas flows from a lower portion of the processing chamber 3 to the upper portion of the processing chamber 3, then, is sucked into the annular space 104.

A control unit 150 is connected to the film forming apparatus 100a. The control unit 150 includes a process controller 151, for example consisting of a microprocessor (computer), and each component of the film forming apparatus 100a is controlled by the process controller 151. A user interface 152 and a memory unit 153 are connected to the process controller 151.

The user interface 152 is provided with an input unit and a display unit. The input unit includes a keyboard or a touch panel display, which are allows an operator to perform the input operation of commands and the like for managing the film forming apparatus 100a. The display unit includes a display for visualizing and displaying the operating status of the film forming apparatus 100a.

The memory unit 153 stores a control program for implementing various kinds of processes performed in the film forming apparatus 100a by controlling the process controller 151. The memory unit 153 also stores a so-called process recipe including a program for performing the processing for the respective components of the film forming apparatus 100a according to processing conditions. The process recipe is stored in a storage medium of the memory unit 153. The storage medium may be a portable memory, such as a CD-ROM, DVD, or flash memory, as well as a hard disk or semiconductor memory. In addition, the process recipe may be suitably transmitted from other units, for example, through a dedicated line.

The process recipe, if necessary, is read from the memory unit 153 by operator's instructions or the like from the user interface 152, and the processing according to the read process recipe is performed by the process controller 151, so that the required processing is performed in the film forming apparatus 100a under the control of the process controller 151. In this example, under the control of the process controller 151, the processing according to the method of forming a carbon film described in the first embodiment is performed in the film forming apparatus 100a.

The method of forming a carbon film according to the first embodiment may be performed, for example, in the vertical batch type film forming apparatus 100a as shown in FIG. 3.

<Dependency of Film Forming Position on Film Forming Temperature>

A carbon film was formed using the vertical batch type film forming apparatus 100a and setting the processing conditions as follows:

Ratio of Gas Flow Rates: $C_2H_4$: $Cl_2$=500:100 sccm
Film Forming Temperature: 500 degrees C.
Processing Pressure: 997.5 Pa (7.5 Torr)
Processing Time: 60 min Under the above processing conditions, the carbon films were formed on the silicon substrates 1 mounted on a lower portion of the boat 112. However, no carbon film was formed on most of the silicon substrates 1 mounted on intermediate and upper portions of the boat 112. The reason may be that most of the ethylene gas and the chlorine gas were reacted at the lower portion of the processing chamber 3 due to the high film forming temperature, when spreading from the lower portion of the processing chamber 3 toward the upper portion thereof.

Figure 4:
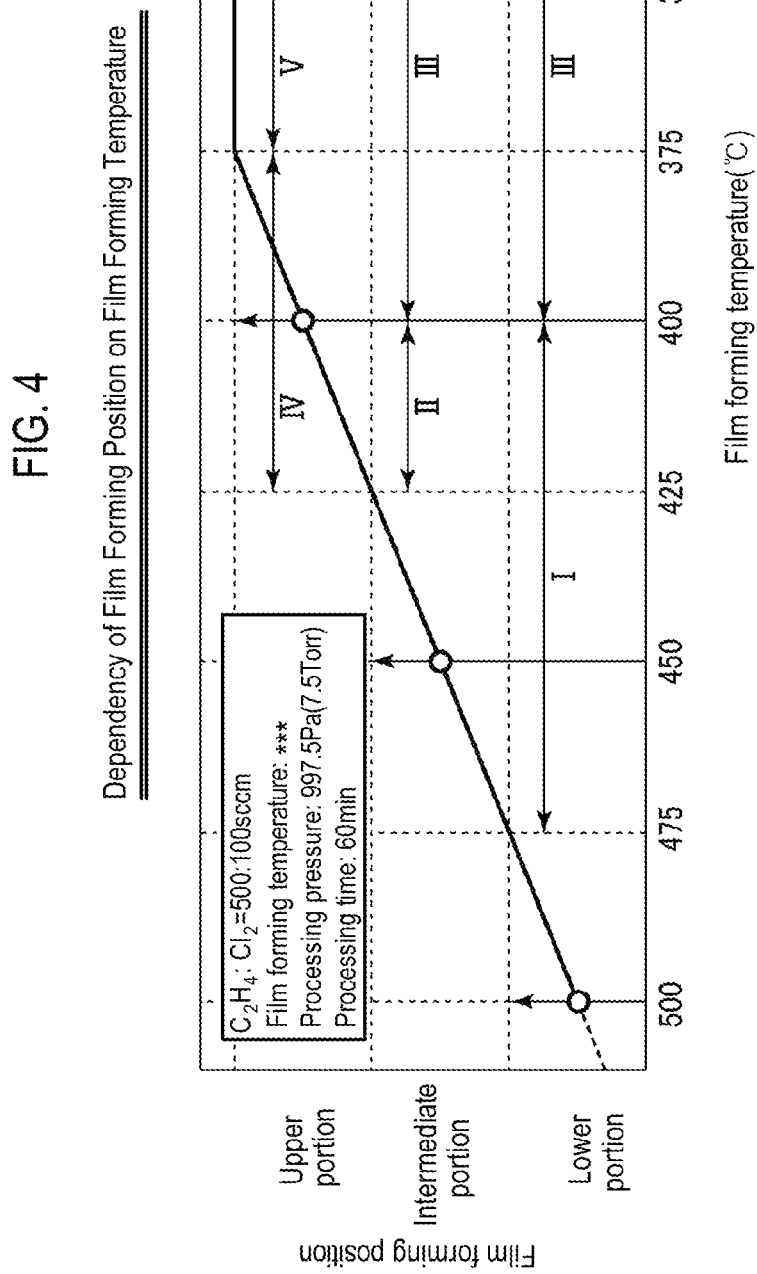
FIG. 4 is a view illustrating dependency of film forming position on film forming temperature in a vertical batch type film forming apparatus.

Therefore, the film forming temperature among the processing conditions was changed as a parameter from 500 degrees C. to 450 degrees C. and 400 degrees C. FIG. 4 is a view illustrating dependency of film forming position on film forming temperature in a vertical batch type film forming apparatus.

As shown in FIG. 4, under the following processing conditions, the carbon films were formed on the silicon substrates 1 mounted on the lower and intermediate portions of the boat 112. No carbon film was formed on most of the silicon substrates 1 mounted on the upper portion of the boat 112. In this example, the processing conditions as follows:

Ratio of Gas Flow Rates: $C_2H_4$:$Cl_2$=500:100 sccm
Film Forming Temperature: 450 degrees C.
Processing Pressure: 997.5 Pa (7.5 Torr)
Processing Time: 60 min In addition, under the following processing conditions, the carbon films were formed on the silicon substrates 1 mounted on the respective lower, intermediate and upper portions of the boat 112. In this example, the processing conditions as follows:

Ratio of Gas Flow Rates: $C_2H_4$:$Cl_2$=500:100 sccm
Film Forming Temperature: 400 degrees C.
Processing Pressure: 997.5 Pa (7.5 Torr)
Processing Time: 60 min In this way, when the method of forming a carbon film according to the first embodiment is applied to the vertical batch type film forming apparatus 100a, it was clearly shown that a film forming position was dependent on the film forming temperature. From this knowledge and the results shown in FIG. 4, it was confirmed as follows:

(1) if the film forming temperature was in a range between 475 degrees C. and 500 degrees C., the carbon films could be formed in the lower portion of the boat 112;

(2) if the film forming temperature was in a range between 425 degrees C. and 475 degrees C., the carbon films could be formed in the lower and intermediate portions of the boat 112; and (3) if the film forming temperature was in a range between 400 degrees C. and 425 degrees C., the carbon films could be formed in the respective lower, intermediate and upper portions of the boat 112.

Therefore, in order to allow the carbon films to be formed on a large number of sheets of the silicon substrates 1, it is preferable that the film forming temperature is set to a range between 400 degrees C. and 475 degrees C. (which is a range indicated by reference numeral I in FIG. 4) rather than a range between 475 degrees C. and 500 degrees C. In addition, if the film forming temperature is set to a range between 400 degrees C. and 425 degrees C. (which is a range indicated by reference numeral II in FIG. 4), it provides an advantageous effect of forming the carbon films on a much larger number of sheets of the silicon substrates 1.

Further, as described in the first embodiment, according to the method of forming a carbon film of the present disclosure, if a gas containing a halogen element among the hydrocarbon ($C_XH_Y$)-based carbon source gases is added, the decomposition of hydrocarbon ($C_XH_Y$) can be promoted. Thus, the carbon film can be formed even if the film forming temperature is 300 degrees C.

In addition, from the results shown in FIG. 4, as the film forming temperature is lowered, the carbon films can be formed up to a high position of the upper portion of the boat 112. Although the film forming temperature is set to a range between 300 degrees C. and 400 degrees C. (which is a range indicated by reference numeral III in FIG. 4), the carbon films can be formed in the respective lower, intermediate and upper portions of the boat 112.

Therefore, Range III (between 300 degrees C. and 400 degrees C.) can be selected as a range of the film forming temperature. In addition to this, Range I+Range III (between 300 degrees C. and 475 degrees C.) may be selected, and Range II+Range III (between 300 degrees C. and 425 degrees C.) may also be selected in terms of more expanding the film forming position.

Also, from the results shown in FIG. 4, if the film forming temperature is 375 degrees C. or lower, the carbon films are formed in the nearly entire area of the upper portion of the boat 112. When a certain level of high temperature is required in forming the carbon film and one wishes to obtain the carbon films in the nearly entire area of the upper portion of the boat 112, a range between 375 degrees C. and 425 degrees C. (which is a range indicated by reference numeral IV in FIG. 4) should be selected. In contrary to this, when a low temperature is required rather than a high temperature in forming a carbon film, a range between 300 degrees C. and 375 degrees C. (which is a range indicated by reference numeral V in FIG. 4) can be selected. Accordingly, it is possible to obtain the carbon films in the nearly entire area of the upper portion of the boat 112.

In addition, it is not necessary to form the carbon films in the entire area through from the lower portion to the upper portion of the boat 112. As shown in FIG. 4, when the film forming temperature is, for example, 500 degrees C., the carbon films can be formed in the lower portion of the boat 112. When a high temperature, for example about 500 degrees C., is required to form the carbon films, the carbon films may be formed using only the lower portion of the boat 112 by setting the film forming temperature to 500 degrees C. In this case, the objects to be processed, for example, the silicon substrates 1, need not to be accommodated in the intermediate portion to the upper portion of the boat 112, in which no carbon film is formed, or dummy silicon substrates may only be to be accommodated in them.

Therefore, a range between 300 degrees C. and 500 degrees C. is preferable as a range of the film forming temperature. Among this range, any one of Range I, Range II, Range III, Range I+Range III, Range II+Range III, Range IV, Range V and the like is selected according to the requirements and the carbon film may be formed.

<Dependency of Film Forming Position on Processing Pressure>

From the results shown in FIG. 4, if the film forming temperature is too high, almost all the ethylene gas and the chlorine gas react in the lower portion of the processing chamber 3. Therefore, after dropping the processing pressure and increasing a flow rate of the ethylene gas and the chlorine gas in the processing chamber 3, it was investigated whether or not the carbon films could be formed in the intermediate and upper portions of the boat 112 even when the film forming temperature is high, for example in the vicinity of 500 degrees C.

Figure 5:
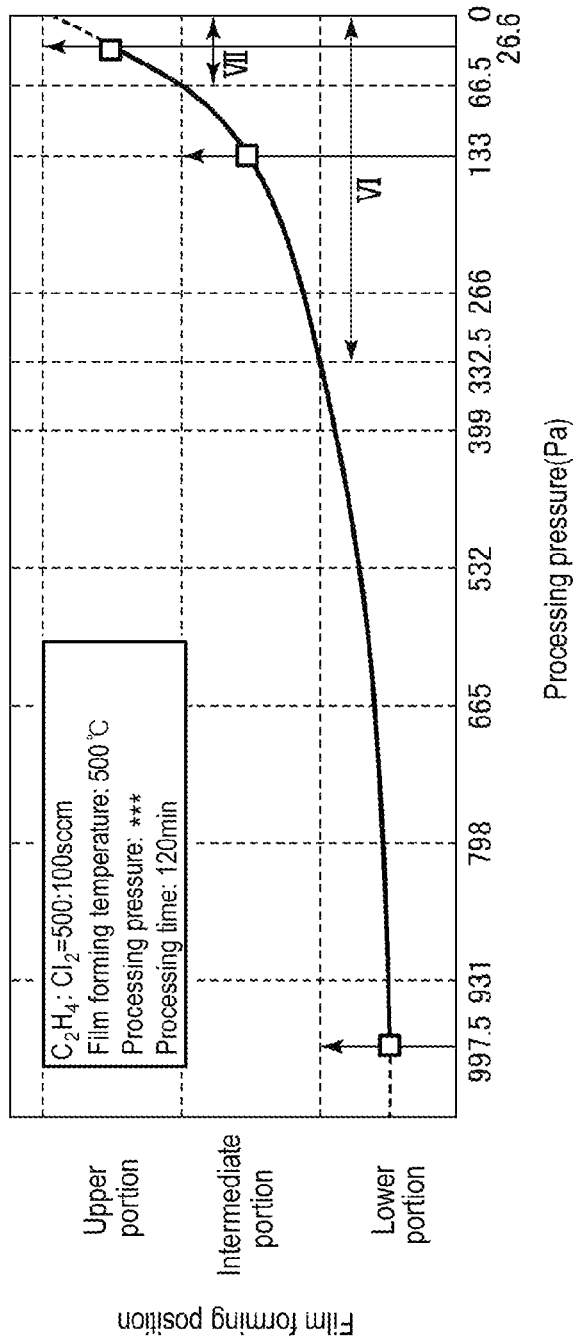
FIG. 5 is a view illustrating dependency of film forming position on processing pressure in a vertical batch type film forming apparatus.

FIG. 5 is a view illustrating dependency of film forming position on processing pressure in a vertical batch type film forming apparatus. In addition, from the results shown in FIG. 5, since if the processing pressure is lowered, the reaction probability of the ethylene gas and the chlorine gas in the processing chamber 3 is reduced, a film forming rate is reduced. Taking this point into consideration, although the processing time was set to 60 min at a processing pressure of 997.5 Pa (7.5 Torr), the processing time was set to 120 min at a processing pressure lower than that.

As shown in FIG. 5, under the following processing conditions, the carbon films were formed on the silicon substrates 1 mounted to the lower and intermediate portions of the boat 112 even when the film forming temperature is 500 degrees C. No carbon film was formed on most of the silicon substrates 1 mounted to the upper portion of the boat 112. In this example, the processing conditions as follows:

Ratio of Gas Flow Rates: $C_2H_4$:$Cl_2$=500:100 sccm
Film Forming Temperature: 500 degrees C.
Processing Pressure: 133 Pa (1 Torr)
Processing Time: 120 min In addition, under the following processing conditions, the carbon films were formed on the silicon substrates 1 mounted to the respective lower, intermediate and upper portions of the boat 112. In this example, the processing conditions as follows:

Ratio of Gas Flow Rates: $C_2H_4$:$Cl_2$=500:100 sccm
Film Forming Temperature: 500 degrees C.
Processing Pressure: 26.6 Pa (0.2 Torr)
Processing Time: 120 min In this way, when the method of forming a carbon film according to the first embodiment is applied to the vertical batch type film forming apparatus 100a, it could be supported that a film forming position was dependent on the processing pressure. From this knowledge and the results shown in FIG. 5, it was confirmed as follows:

(1) if the processing pressure was in a range between 332.5 Pa (2.5 Torr) and 997.5 Pa (7.5 Torr), the carbon films could be formed in the lower portion of the boat 112;

(2) if the processing pressure was in a range between 66.5 Pa (0.5 Torr) and 332.5 Pa (2.5 Torr), the carbon films could be formed in the lower and intermediate portions of the boat 112; and (3) if the processing pressure was in a range between 0 Pa (0 Torr) and 66.5 Pa (0.5 Torr), the carbon films could be formed in the respective lower, intermediate and upper portions of the boat 112.

Therefore, the processing pressure may be ranged between 0 Pa (0 Torr) and 997.5 Pa (7.5 Torr), and particularly, in order to form the carbon films on a large number of sheets of the silicon substrates 1, it is preferable that the processing pressure is set to a range between 0 Pa and 332.5 Pa (which is a range indicated by reference numeral VI in FIG. 5) rather than a range between 332.5 Pa and 997.5 Pa. In addition, if the processing pressure is set to a range between 0 Pa and 66.5 Pa (which is a range indicated by reference numeral VII in FIG. 5), it is advantageous in that a much larger number of sheets of the silicon substrates 1 on which the carbon films are formed can be obtained.

Third Embodiment

A third embodiment relates to an example of the film forming method for improving adhesion between a carbon film and an underlayer to be more satisfactory.

Figure 7A:
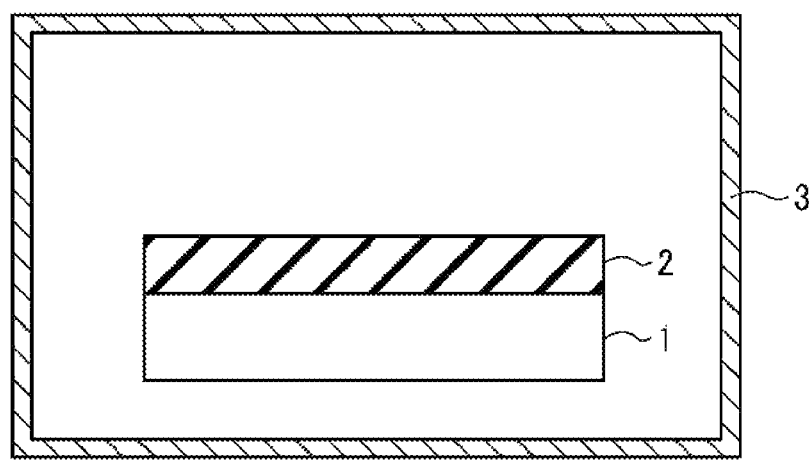
FIGS. 7A and 7B are sectional views schematically showing a state of an object to be processed.
Figure 7B:
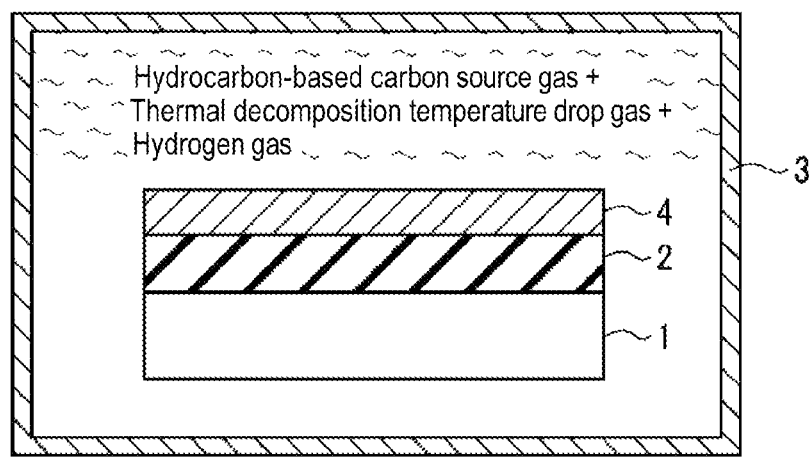

FIG. 6 is a flow chart illustrating an example of a method of forming a carbon film according to the third embodiment of the present disclosure, and FIGS. 7A and 7B are sectional views schematically showing a state of an object to be processed. Also, FIGS. 7A and 7B schematically show the processing chamber of the film forming apparatus.

As shown in FIG. 6 and FIGS. 7A and 7B, the third embodiment is different from the first embodiment in that as shown in Process 3 following Process 1 in that when the carbon film 4 is formed, hydrogen ($H_2$) gas is introduced into the processing chamber 3, in addition to the hydrocarbon-based carbon source gas and the thermal decomposition temperature drop gas.

If the hydrogen gas is added this way, the hydrogen gas is recombined to the hydrocarbon-based carbon source ($C_xH_y$) that is thermally decomposed, so that, for example, ethylene ($C_2H_4$) gas is changed into higher order hydrocarbon like propane ($C_3H_8$) gas and the carbon film 4 is only formed of high crystalline carbon.

In this way, when the carbon film 4 is formed, the hydrocarbon-based carbon source gas, the thermal decomposition temperature drop gas and the hydrogen gas are introduced into the processing chamber 3, so that the carbon film 4 having high crystallinity can be formed. Accordingly, it provides an advantageous effect of enhancing adhesion between the carbon film 4 and an underlayer, e.g., the silicon oxide film 2, in this example.

Figure 8:
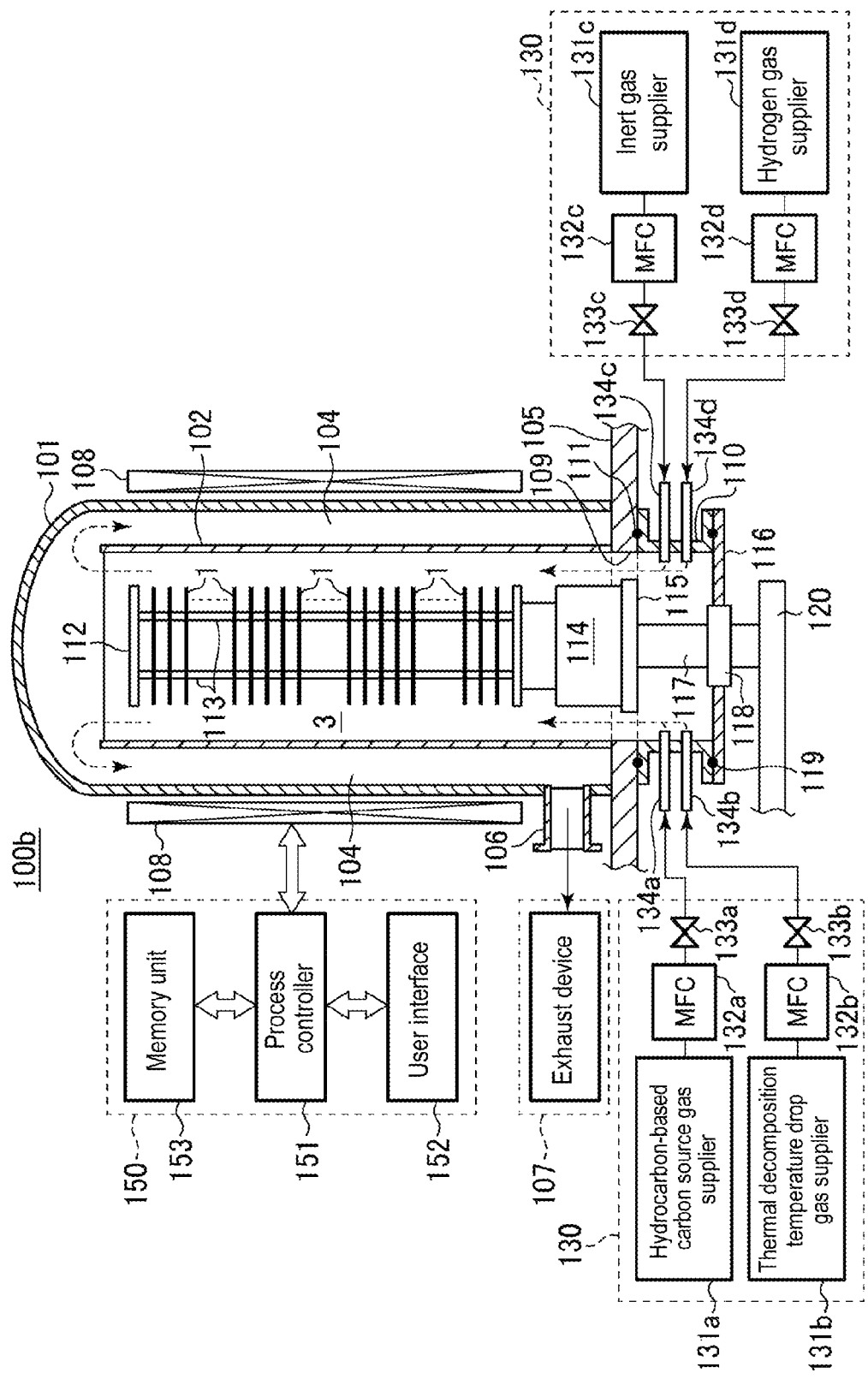
FIG. 8 is a sectional view schematically showing an example of a vertical batch type film forming apparatus for performing the method of forming a carbon film according to the third embodiment of the present disclosure to be performed.

FIG. 8 is a sectional view schematically showing an example of a vertical batch type film forming apparatus for the method of forming a carbon film according to the third embodiment of the present disclosure.

As shown in FIG. 8, a film forming apparatus 100b is different from the film forming apparatus 100a shown in FIG. 3 in that the processing gas supply mechanism 130 further includes a hydrogen gas supplier 131d. The hydrogen gas supplier 131d is connected to a gas supply port 134d via a mass flow controller (MFC) 132d and an opening/closing valve 133d. The gas supply port 134d is installed to penetrate the sidewall of the manifold 110 in the horizontal direction in the same manner as the gas supply ports 134a to 134c. The gas supply port 134d allows the supplied gas to spread toward the interior of the processing chamber 3 above the manifold 110.

The method of forming a carbon film according to the third embodiment may be performed, for example, by the vertical batch type film forming apparatus 100b as shown in FIG. 8.

Fourth Embodiment

A fourth embodiment relates to other examples of the film forming method improving adhesion between a carbon film and an underlayer to be more satisfactory.

One Example

Figure 10A:
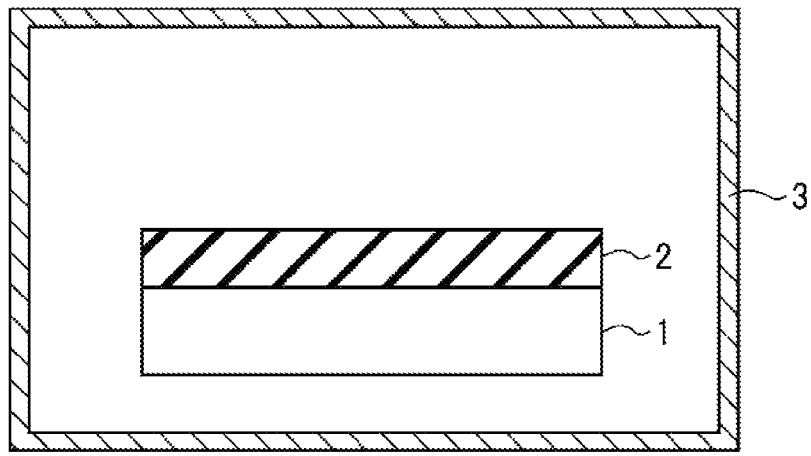
FIGS. 10A to 10C are sectional views schematically showing a state of an object to be processed.
Figure 10B:
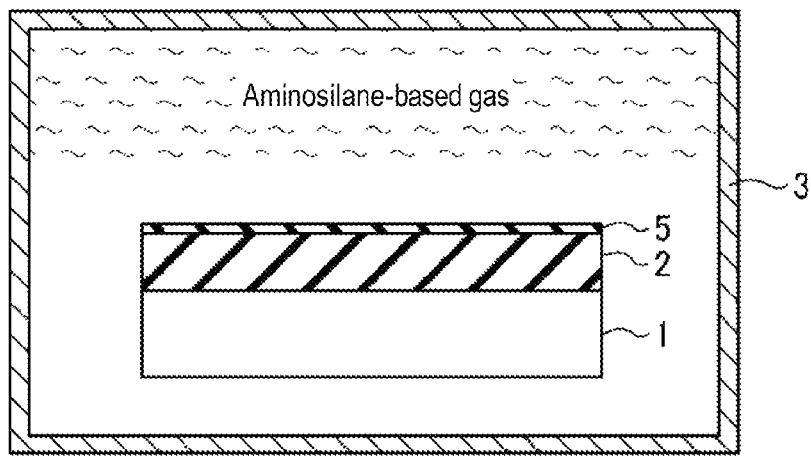
Figure 10C:
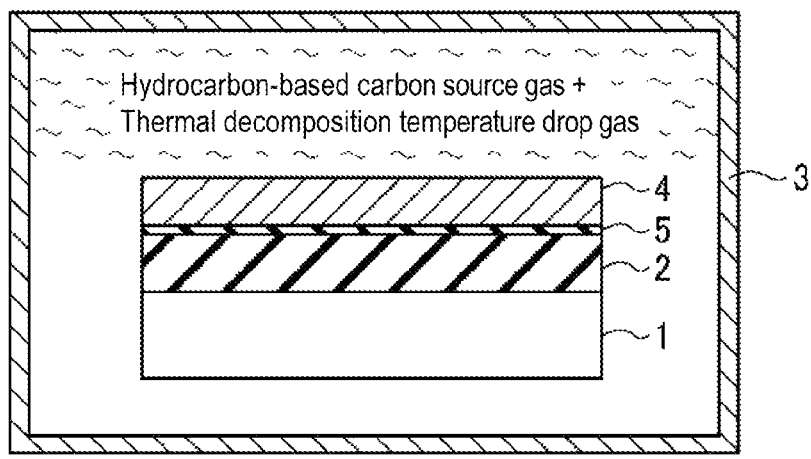

FIG. 9 is a flow chart illustrating one example of a method of forming a carbon film according to the fourth embodiment of the present disclosure, and FIGS. 10A to 10C are sectional views schematically showing a state of an object to be processed. Also, FIGS. 10A to 10C schematically show the processing chamber of the film forming apparatus.

As shown in FIG. 9 and FIGS. 10A to 10C, an example of the fourth embodiment is different from the first embodiment in that a process of forming an adhesion improving layer 5 on top of the substrate to be processed for improving adhesion between the carbon film 4 and an underlayer is provided (Process 4). Process 4 is performed between Process 1 and Process 2. According to this example, the adhesion improving layer 5 is formed between the carbon film 4 and the silicon oxide film 2.

As shown in Process 4 of FIG. 9 and FIG. 10B, in order to form the adhesion improving layer 5 in this example, the substrate to be processed, e.g., the silicon substrate 1 with the silicon oxide film 2, is heated in the processing chamber 3, and aminosilane-based gas is introduced into the processing chamber 3. Accordingly, aminosilane contained in the aminosilane-based gas is absorbed on the substrate to be processed (or on the underlayer), e.g., on the silicon oxide film 2 in this example, thus, the adhesion improving layer 5 is formed.

An example of the aminosilane-based gas includes gases containing at least one of:
BAS (butylaminosilane),
BTBAS (bis(tertiary-butylamino)silane),
DMAS (dimethylaminosilane),
BDMAS (bis(dimethylamino)silane),
TDMAS (tris(dimethylamino)silane),
DEAS (diethylaminosilane),
BDEAS (bis(diethylamino)silane),
DPAS (dipropylaminosilane),
DIPAS (diisopropylaminosilane), and the like
In this example, BTBAS was used.

An example of processing conditions in Process 4 is as follows:
BTBAS Flow Rate: 100 sccm
Processing Time: 5 min
Processing Temperature: 400 degrees C.
Processing Pressure: 13.3 Pa (0.1 Torr).

Thereafter, as shown in Process 2 of FIG. 9 and FIG. 10C, the carbon film 4 is formed on top of the substrate to be processed, e.g., on the adhesion improving layer 5 in this example, by the film forming method described in the first embodiment. In this example, the adhesion improving layer 5 is a nitrogen-containing silicon layer with rich silicon.

In this way, before the carbon film 4 is formed, the aminosilane-based gas is introduced into the processing chamber 3 and the adhesion improving layer 5 is formed on the underlayer. It provides an advantageous effect in that adhesion between the carbon film 4 and the underlayer, e.g., the silicon oxide film 2 in this example can be improved.

FIG. 11 is a sectional view schematically showing an example of a vertical batch type film forming apparatus for performing the one example of the method of forming a carbon film according to the fourth embodiment of the present disclosure to be performed.

As shown in FIG. 11, a film forming apparatus 100c is different from the film forming apparatus 100a shown in FIG. 3 in that the processing gas supply mechanism 130 further includes an aminosilane-based gas supplier 131e. The aminosilane-based gas supplier 131e is connected to a gas supply port 134e via a mass flow controller (MFC) 132e and an opening/closing valve 133e. The gas supply port 134e is provided to penetrate the sidewall of the manifold 110 in the horizontal direction in the same manner as the gas supply ports 134a to 134c and allows the supplied gas to spread toward the interior of the processing chamber 3 above the manifold 110.

The method of forming a carbon film according to the one example of the fourth embodiment may be performed, for example, by the vertical batch type film forming apparatus 100c as shown in FIG. 11.

In addition, the vertical batch type film forming apparatus 100c shown in FIG. 11 can provide an advantageous effect in that forming the adhesion improving layer 5 and then forming the carbon film 4 may be performed in situ in the same processing chamber 3 and the throughput can be improved.

Another Example

FIG. 12 is a flow chart illustrating another example of the method of forming a carbon film according to the fourth embodiment of the present disclosure.

The fourth embodiment may be combined with not only the first embodiment but also the third embodiment. As shown in FIG. 12, the other example of the fourth embodiment is different from the third embodiment in that a process of forming an adhesion improving layer 5 for improving adhesion between the carbon film 4 and the silicon oxide film 2 (Process 4) is provided between Process 1 and Process 3.

In this way, the fourth embodiment may be combined with the third embodiment, and the carbon film 4 having high crystallinity can be formed on the adhesion improving layer 5. Thus, the adhesion can be further improved.

FIG. 13 is a sectional view schematically showing an example of a vertical batch type film forming apparatus for performing the other example of the method of forming a carbon film according to the fourth embodiment of the present disclosure to be performed.

As shown in FIG. 13, a film forming apparatus 100d is different from the film forming apparatus 100b shown in FIG. 8 in that the processing gas supply mechanism 130 further includes an aminosilane-based gas supplier 131e.

The method of forming a carbon film according to the other example of the fourth embodiment may be performed, for example, by the vertical batch type film forming apparatus 100d as shown in FIG. 13.

Fifth Embodiment

A fifth embodiment relates to a method of manufacturing a semiconductor device using the method of forming a carbon film according to the first, third or fourth embodiment.

FIGS. 14A to 14H are sectional views showing an example of a method of manufacturing a semiconductor device according to the fifth embodiment of the present disclosure.

This example is an example in which the method of forming a carbon film according to the embodiment of the present disclosure is applied to a double patterning process.

Figure 14A:
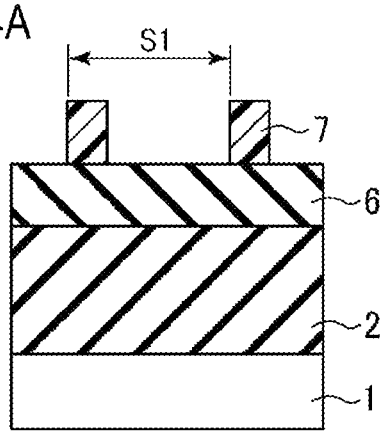
FIGS. 14A to 14H are sectional views showing an example of a method of manufacturing a semiconductor device according to a fifth embodiment of the present disclosure.

As shown in FIG. 14A, for example, the silicon oxide film 2 is formed on the silicon substrate 1, and a silicon nitride film 6 is formed on the silicon oxide film 2. The silicon nitride film 6 is a film which will be a core material in a double patterning process later. A photoresist film 7 is formed on the silicon nitride film 6. The photoresist film 7 is developed, for example, in a line and space pattern, in which a spacing S1 between lines is, for example, a minimum resolution limit in photolithography.

Figure 14B:
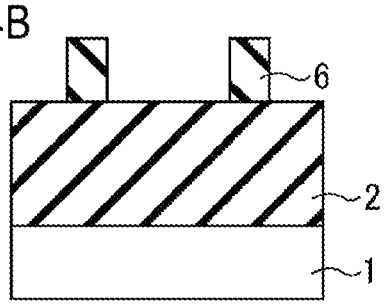

Then, as shown in FIG. 14B, the photoresist film 7 is used as a mask, and the silicon nitride film 6 is etched, for example, by a reactive ion etching (RIE) method. Subsequently, the photoresist film 7 is removed. Accordingly, a pattern of the photoresist film 7 is transferred to the silicon nitride film 6, and the silicon nitride film 6 is patterned in a line and space pattern.

Figure 14C:
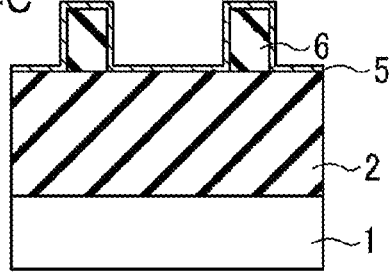

Next, as shown in FIG. 14C, while the silicon substrate 1 is heated, the aminosilane-based gas is supplied onto the silicon oxide film 2 and the silicon nitride film 6. Then, the adhesion improving layer 5 in the fourth embodiment are formed. The formation of the adhesion improving layer 5 in this example provides an advantageous effect. When the carbon film is formed later on the different films of the underlayer such as the silicon oxide film 2 and the silicon nitride film 6, it can be prevented that the carbon film shows the different adhesive properties between on the silicon oxide film 2 and on the silicon nitride film 6. As such, when different films, such as the silicon oxide film 2 and the silicon nitride film 6, exist in the underlayer, it is preferable that the adhesion improving layer 5 is formed. In this case, since the carbon film can be formed only on a single layer of the adhesion improving layer 5 later, it is possible to solve the problem that the adhesive properties of the carbon film becomes largely different, even when different films are exist in the underlayer.

Figure 14D:
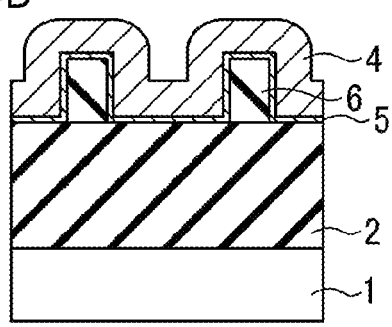

Then, as shown in FIG. 14D, according to the method of forming a carbon film described in the first or third embodiment, the carbon film 4 is formed on the adhesion improving layer 5.

Figure 14E:
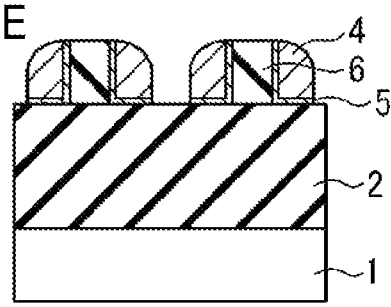

As shown in FIG. 14E, the carbon film 4 is then etched using an RIE method, the carbon film 4 is left in a sidewall shape on the side walls of the silicon nitride film 6.

Figure 14F:
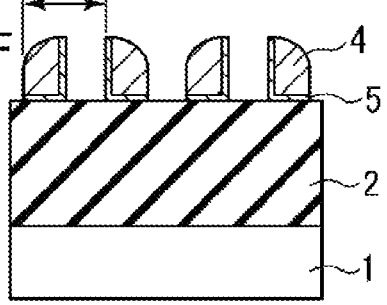

Then, as shown in FIG. 14F, since it is difficult to etch the carbon film 4 and the silicon oxide film 2, the silicon nitride film 6 is etched under the condition that the silicon nitride film 6 is easily etched, thereby removing the silicon nitride film 6. Accordingly, a spacing S2 in the carbon film 4 is a half of the minimum resolution limit S1 in photolithography shown in FIG. 14A.

Figure 14G:
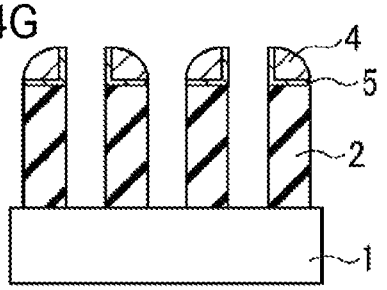

As shown in FIG. 14G, the carbon film 4 is then used as a mask to etch the silicon oxide film 2, for example, using an RIE method.

Figure 14H:
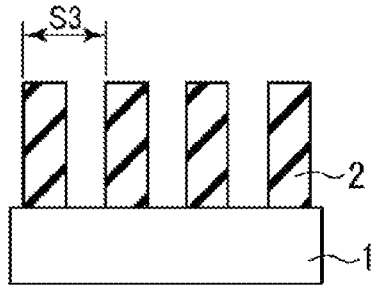

As shown in FIG. 14H, the carbon film 4 and the adhesion improving layer 5 are then removed. Accordingly, the silicon oxide film 2 is patterned to have a spacing S3 that is a half of the minimum resolution limit S1 in photolithography.

The film forming method according to the first, third or fourth embodiment of the present disclosure can be applied to forming the carbon film 4, for example, used as mask material in a double patterning process.

Also, the method of forming a carbon film according to the first, third or fourth embodiment makes it possible to form the carbon film 4 at a low temperature, for example, of 300 degrees C. to 500 degrees C. For this reason, as described above, the carbon film can also be formed on an upper layer portion of a semiconductor device. Further, since the carbon film can be formed under non-plasma conditions without using plasma assistance, the good step coatability may be obtained. For this reason, it is possible to apply the double patterning process to an upper layer portion of a semiconductor device.

An example in which such a double patterning process is applied to an upper layer portion of a semiconductor device will be described.

Figure 15A:
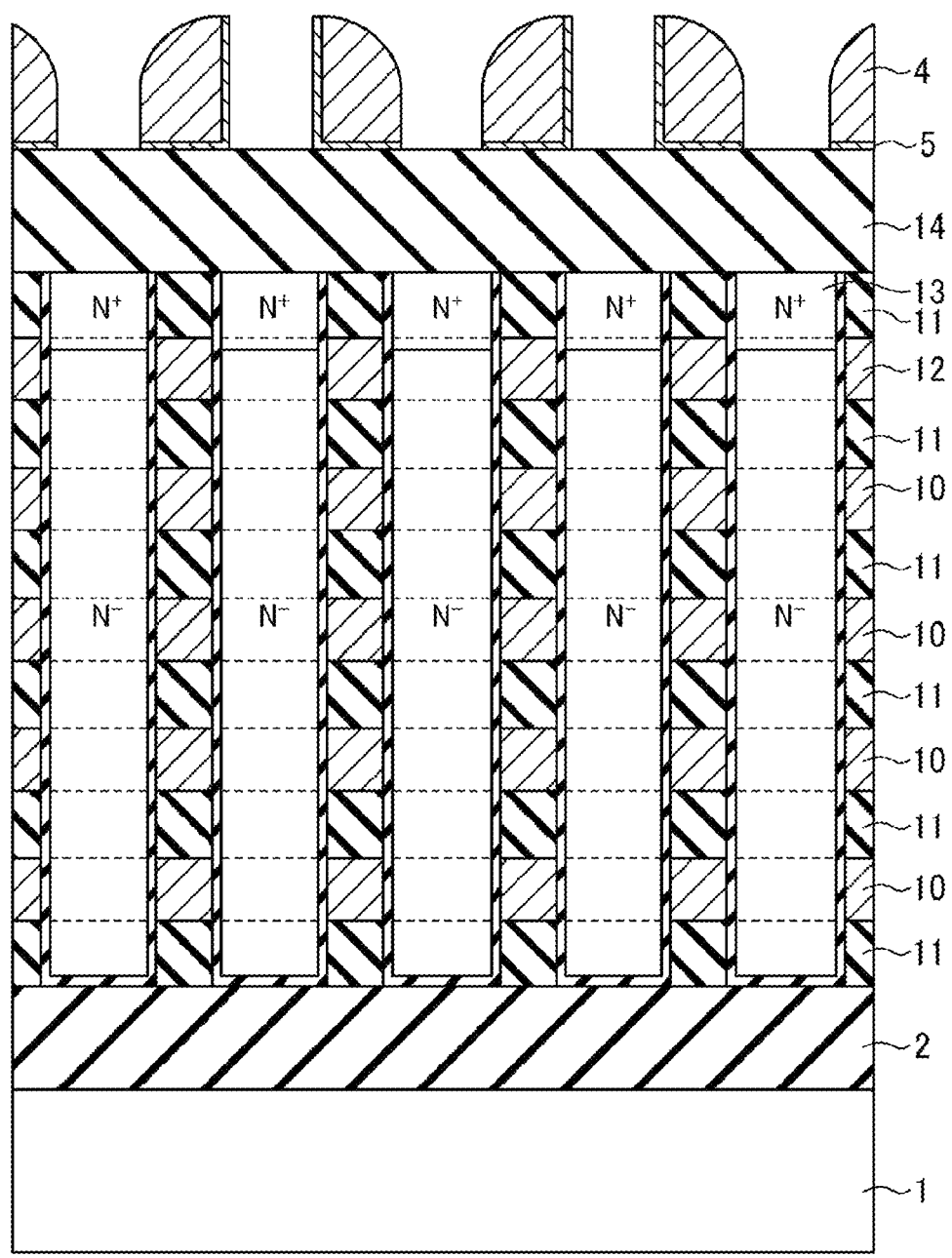
FIG. 15A is a sectional view showing another example of the method of manufacturing a semiconductor device according to the fifth embodiment of the present disclosure.
Figure 15B:
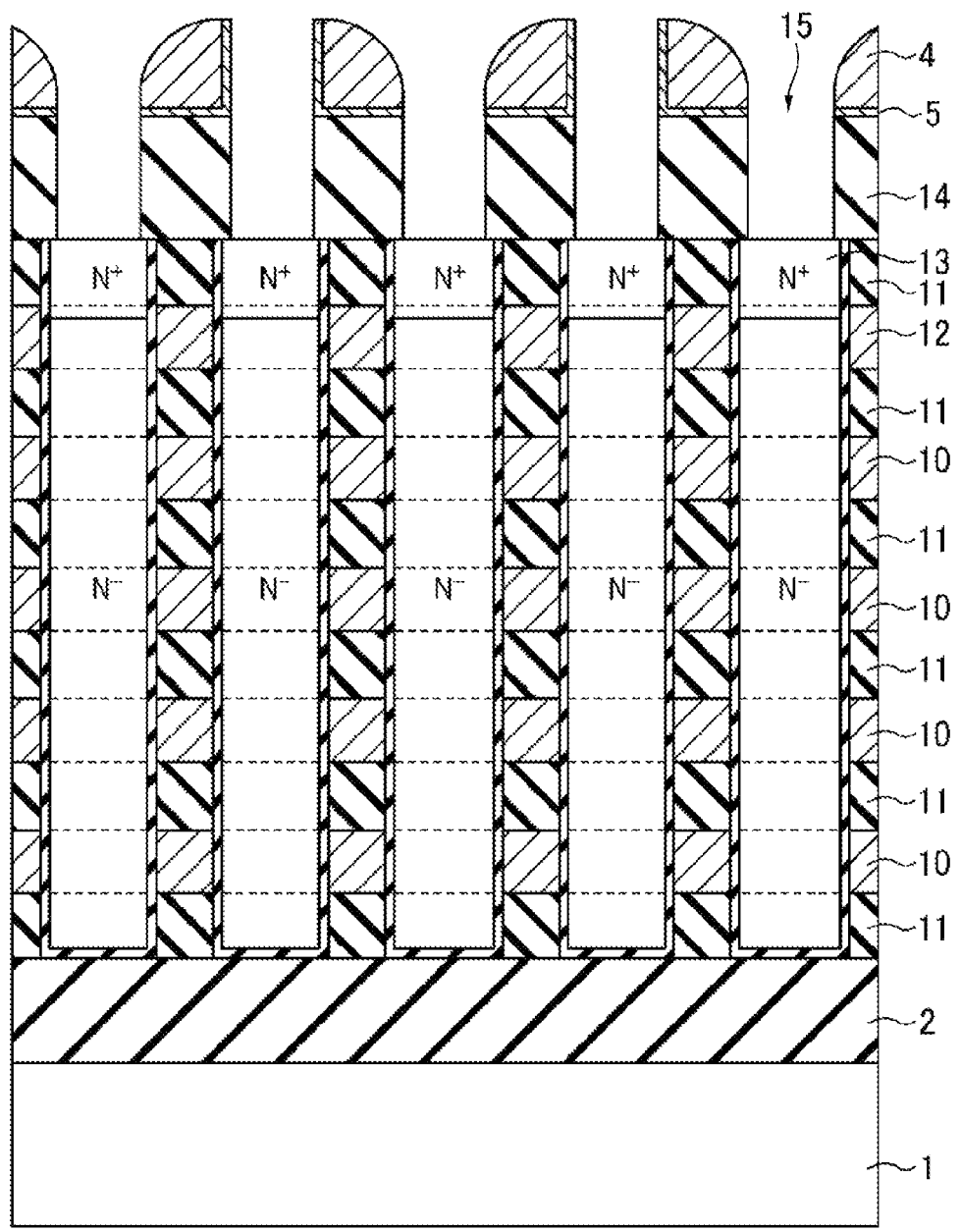
FIG. 15B is a sectional view showing the other example of the method of manufacturing a semiconductor device according to the fifth embodiment of the present disclosure.
Figure 15C:
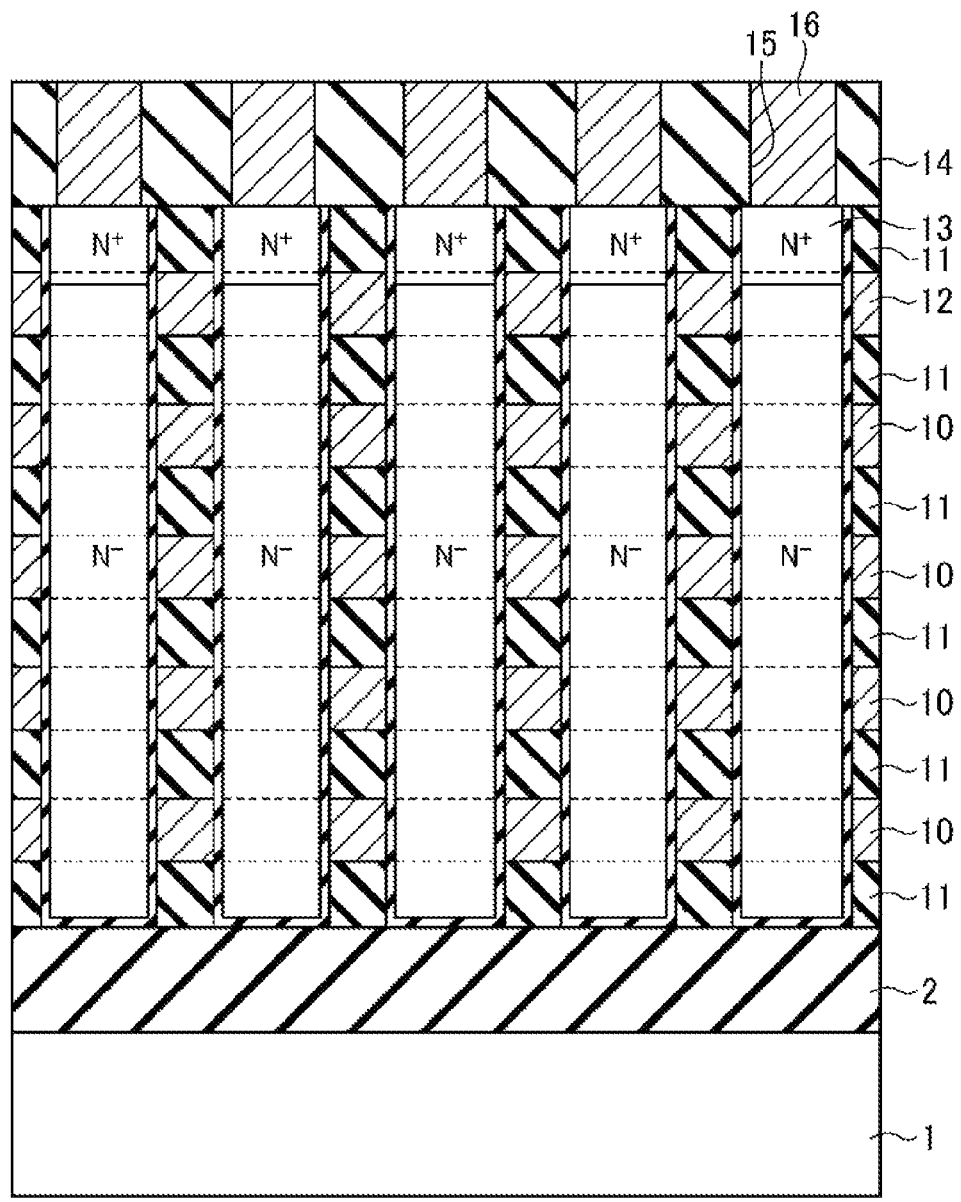
FIG. 15C is a sectional view showing the other example of the method of manufacturing a semiconductor device according to the fifth embodiment of the present disclosure.

FIGS. 15A to 15C are sectional views showing another example of the method of manufacturing a semiconductor device according to the fifth embodiment of the present disclosure.

FIG. 15A shows a sectional structure of a memory cell array of a non-volatile semiconductor memory device. The memory cell array shown in FIG. 15A has a structure in which a plurality of word lines 10 are stacked in the vertical direction while being insulated from each other by interlayer insulation films 11, and by making the uppermost layer of the word lines 10 select gate lines 12, channels of memory cell transistors are formed in pillar-shaped silicon layers to be in the vertical direction with respect to the silicon substrate 1. Bit lines are connected to a drain diffusion layer 13 of a select transistor that is the uppermost layer of the memory cell array. The double patterning using the carbon film 4 as a mask is employed in the formation of the bit lines of such a memory cell array.

As shown in FIG. 15A, the adhesion improving layer 5 and the carbon film 4 are formed on an uppermost interlayer insulation film 14 according to the method of forming a carbon film described with reference to FIGS. 14A to 14F.

Then, as shown in FIG. 15B, the carbon film 4 is used as a mask to etch the uppermost interlayer insulation film 14 until the drain diffusion layer 13 is exposed. Accordingly, grooves 15 for burying of bit lines are formed.

Then, as shown in FIG. 15C, after the carbon film 4 and the adhesion improving layer 5 are removed, the grooves 15 are filled with a conductor material. Accordingly, bit lines 16 can be formed, for example, at a space less than the minimum resolution limit in photolithography.

Since the method of forming a carbon film according to the embodiment as described above provides the carbon film 4 to be formed at low temperature, the method can be applied to an upper layer portion of a semiconductor device. For this reason, in a semiconductor device having a multilayer wiring structure, the double patterning process can also be applied, for example, to a wiring structure of the upper layer portion.

According to the present disclosure, it is possible to provide a method of forming a carbon film, which provides a carbon film having good step coatability to be formed at a lower temperature than a conventional thermal CVD method, and an apparatus for performing the film forming method.

Although the present disclosure has been described with reference to the first to fifth embodiments, the present disclosure is not limited to the first to fifth embodiments, but various modifications can be made within the scope without departing from the spirit of the present disclosure.

For example, the processing conditions are specifically illustrated in the above embodiments, but the processing conditions are not limited to the specific examples.

In addition, although as an example, the carbon film is formed using the vertical batch type film forming apparatus in the embodiments, not only single type film forming apparatuses but also batch type film forming apparatuses other than the vertical type may also be used.

Further, although as an example, the bit lines of the non-volatile semiconductor memory device have been illustrated as a multilayer wiring structure, and the method of forming a carbon film according to the embodiments and the double patterning process are applied to the formation of the bit lines, the multilayer wiring structure is not limited to the bit lines.

While certain embodiments have been described, these embodiments have been presented by way of example only, and are not intended to limit the scope of the disclosures. Indeed, the novel methods and apparatuses described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a carbon film on a substrate to be processed, comprising:
    loading a substrate to be processed, on which a carbon film is formed, into a processing chamber of a film forming apparatus; and
    forming a carbon film on the substrate to be processed by thermally decomposing a hydrocarbon-based carbon source gas in the processing chamber, forming the carbon film comprising;
        supplying the hydrocarbon-based carbon source gas into the processing chamber, wherein a simple substance of the hydrocarbon-based carbon source gas is thermally decomposed without plasma assistance at a thermal decomposition temperature; and
        dropping a temperature of the processing chamber to be less than the thermal decomposition temperature by adding a thermal decomposition temperature drop gas containing a halogen element to the hydrocarbon-based carbon source gas into the processing chamber,
    wherein a film forming temperature of the carbon film is set at a temperature less than the thermal decomposition temperature, and
    a non-plasma thermal CVD method is performed in forming the carbon film on the substrate to be processed.

2. The method of claim 1, wherein the thermal decomposition temperature drop gas containing the halogen element is selected from gases containing at least one of fluorine (F), chlorine (Cl), bromine (Br), and iodine (I).

3. The method of claim 1, wherein the hydrocarbon-based carbon source gas is selected from gases containing a hydrocarbon represented by at least one of molecular formulae of $C_nH_{2n+2}$, $C_mH_{2m}$, and $C_mH_{2m-2}$, and
    wherein n is a natural number equal to or larger than 1, and m is a natural number equal to or larger than 2.

4. The method of claim 3, wherein the hydrocarbon-based carbon source gas represented by the molecular formula of $C_mH_{2m}$, or the hydrocarbon-based carbon source gas having a thermal decomposition temperature lower than a decomposition temperature of a simple substance of the hydrocarbon-based carbon source gas represented by the molecular formula of $C_mH_{2m}$ is selected.

5. The method of claim 1, before forming the carbon film, further comprising forming an adhesion improving layer on the substrate to be processed by heating the substrate to be processed in the processing chamber and introducing an aminosilane-based gas into the processing chamber, wherein the adhesion improving layer improves adhesion between the carbon film and the substrate to be processed.

6. The method of claim 5, wherein the adhesion improving layer is formed by adsorbing aminosilane contained in the aminosilane-based gas onto the substrate to be processed.

7. The method of claim 6, wherein the adhesion improving layer is a nitrogen-containing silicon layer with rich silicon.

8. The method of claim 5, wherein the aminosilane-based gas is selected from gases containing at least one of BAS (butylaminosilane), BTBAS (bis(tertiary-butylamino)silane), DMAS (dimethylaminosilane), BDMAS (bis(dimethylamino)silane), TDMAS (tris(dimethylamino)silane), DEAS (diethylaminosilane), BDEAS (bis(diethylamino)silane), DPAS (dipropylaminosilane), and DIPAS (diisopropylaminosilane).

9. The method of claim 5, wherein forming the adhesion improving layer and then forming the carbon film are performed in situ.

10. The method of claim 1, wherein forming the carbon film is performed by a batch process of forming the carbon films on a plurality of the substrates to be processed at the same time.

11. The method of claim 9, wherein forming the carbon film and forming the adhesion improving layer are performed by batch process of forming the carbon films on a plurality of the substrates to be processed at the same time and forming the adhesion improving layer on the plurality of substrates to be processed at the same time, respectively.

12. The method of claim 1, wherein the film forming temperature of the carbon film in forming the carbon film is set to a range between 300 degrees C. and 500 degrees C., and
a processing pressure in forming the carbon film is set to a range between 0 Pa and 997.5 Pa.

13. The method of claim 10, wherein, when the batch process is performed, the plurality of substrates to be processed are arranged in a vertical direction, and the hydrocarbon-based carbon source gas and the thermal decomposition temperature drop gas containing the halogen element are supplied from a lower portion of the substrates toward an upper portion the substrates,
wherein the film forming temperature of the carbon film in forming the carbon film is set to a range between 300 degrees C. and 475 degrees C., and
wherein a processing pressure in forming the carbon film is set to a range between 0 Pa and 997.5 Pa.

14. The method of claim 13, wherein the film forming temperature of the carbon film in in forming the carbon film is set to a range between 300 degrees C. and 425 degrees C.

15. The method of claim 10, wherein, when the batch process is performed, the plurality of substrates to be processed are arranged in a vertical direction, and the hydrocarbon-based carbon source gas and the thermal decomposition temperature drop gas containing the halogen element are supplied from a lower portion of the substrates toward an upper portion the substrates,
wherein the film forming temperature of the carbon film in forming the carbon film is set to a range between 300 degrees C. and 500 degrees C., and
wherein a processing pressure in forming the carbon film is set to a range between 0 Pa and 332.5 Pa.

16. The method of claim 15, wherein the processing pressure in forming the carbon film is set to a range between 0 Pa and 66.5 Pa.

17. The method of claim 1, wherein in forming the carbon film, a hydrogen gas is further introduced.

18. An apparatus of forming a carbon film on a substrate to be processed, comprising:
a processing chamber configured to accommodate a substrate to be processed and including an underlayer on which a carbon film will be formed;
a processing gas supply mechanism configured to supply the processing chamber with gas used in processing;
a heating device configured to heat the substrate to be processed accommodated in the processing chamber; and
a control unit configured to control the processing gas supply mechanism and the heating device,
wherein the control unit controls the processing gas supply mechanism and the heating device so as to perform the method of forming a carbon film described in claim 1.

* * * * *